US010389172B2

(12) United States Patent
Soroka

(10) Patent No.: US 10,389,172 B2
(45) Date of Patent: Aug. 20, 2019

(54) EXTERNALLY EXPOSING CONNECTIONS TO INTERNAL ELECTRICAL COMPONENTS INSIDE ELECTRICAL SYSTEM EQUIPMENT

(71) Applicant: Microsoft Technology Licensing, LLC, Redmond, WA (US)

(72) Inventor: Joe Soroka, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 141 days.

(21) Appl. No.: 15/630,914

(22) Filed: Jun. 22, 2017

(65) Prior Publication Data

US 2018/0375375 A1 Dec. 27, 2018

(51) Int. Cl.
| H02J 13/00 | (2006.01) |
| H01R 25/00 | (2006.01) |
| H01R 27/02 | (2006.01) |
| H05K 7/02 | (2006.01) |
| H02J 3/00 | (2006.01) |

(52) U.S. Cl.
CPC ........ *H02J 13/0017* (2013.01); *H01R 25/006* (2013.01); *H01R 27/02* (2013.01); *H02J 3/00* (2013.01); *H05K 7/02* (2013.01); *H02J 2003/007* (2013.01)

(58) Field of Classification Search
CPC .... H02J 13/0017; H01R 25/006; H01R 27/02
See application file for complete search history.

(56) References Cited

U.S. PATENT DOCUMENTS

| 6,647,474 B2 | 11/2003 | Yanai et al. |
| 7,327,558 B2 | 2/2008 | Kennedy et al. |
| 7,385,406 B1 | 6/2008 | Blades |
| 7,714,735 B2 | 5/2010 | Rockwell |

(Continued)

FOREIGN PATENT DOCUMENTS

| CA | 2722946 A1 | 9/2009 |
| CN | 201830033 U | 5/2011 |

(Continued)

OTHER PUBLICATIONS

"WINSTA—Perfectly Plugged Electrical Building Installations", http://web.archive.org/web/*/http:/www.wago.com/infomaterial/pdf/60290918.pdf, Published on: Aug. 28, 2016, 24 pages.

(Continued)

*Primary Examiner* — Robert L Deberadinis
(74) *Attorney, Agent, or Firm* — Buckley, Maschoff & Talwalkar LLC

(57) ABSTRACT

Aspects of the invention extend to an apparatus (e.g., a panel or a device) including externally exposed connections (e.g., ports) to internal power system electrical wiring inside a piece of electrical equipment. In one aspect, during manufacture of a piece of electrical equipment, a panel is integrated into an external surface of the piece of electrical equipment. In another aspect, a panel or device is fitted to an external surface of a piece of electrical equipment at a facility. A panel or device includes one or more ports externally exposing internal power system electrical wiring inside the piece of electrical equipment. Each of the one or more ports is wired to a portion of the internal power system electrical wiring. Connecting external devices to the internal power system wiring at the ports increases safety during electrical system commissioning.

20 Claims, 11 Drawing Sheets

(56) References Cited

U.S. PATENT DOCUMENTS

| | | |
|---|---|---|
| 8,001,403 B2 | 8/2011 | Hamilton et al. |
| 8,321,163 B2 | 11/2012 | Ewing et al. |
| 8,467,985 B2 | 6/2013 | Bickel |
| 8,494,803 B2 | 7/2013 | Hasse et al. |
| 8,600,575 B2 | 12/2013 | Weston et al. |
| 8,811,377 B1 | 8/2014 | Weston et al. |
| 8,954,610 B2 | 2/2015 | Berke et al. |
| 9,013,206 B2 | 4/2015 | Muller et al. |
| 9,031,824 B2 | 5/2015 | Nasle |
| 9,041,250 B1 | 5/2015 | Czamara |
| 9,210,220 B2 | 12/2015 | Steckley et al. |
| 9,282,427 B2 | 3/2016 | Hill et al. |
| 9,401,593 B2 | 7/2016 | Gascuel |
| 2006/0103549 A1 | 5/2006 | Hunt et al. |
| 2007/0059986 A1 | 3/2007 | Rockwell |
| 2010/0191487 A1 | 7/2010 | Rada et al. |
| 2011/0144932 A1 | 6/2011 | Alles |
| 2012/0271576 A1 | 10/2012 | Kamel et al. |
| 2013/0103440 A1 | 4/2013 | Imani |
| 2013/0262685 A1 | 10/2013 | Shelton et al. |
| 2014/0253093 A1 | 9/2014 | Bermudez rodriguez et al. |
| 2014/0281598 A1 | 9/2014 | Nasta |
| 2015/0019156 A1 | 1/2015 | Pei et al. |
| 2015/0057821 A1 | 2/2015 | Nasle |
| 2016/0028275 A1 | 1/2016 | Kamel et al. |
| 2018/0278090 A1 | 9/2018 | Soroka |

FOREIGN PATENT DOCUMENTS

| | | |
|---|---|---|
| CN | 202634082 U | 12/2012 |
| CN | 202929156 U | 5/2013 |
| CN | 105137231 A | 12/2015 |
| EP | 2602929 A1 | 6/2013 |
| WO | 2001073329 A1 | 10/2001 |
| WO | 2016028710 A1 | 2/2016 |

OTHER PUBLICATIONS

Bell, et al., "Wireless Sensors Improve Data Center Energy Efficiency", https://www1.eere.energy.gov/femp/pdfs/wireless_sensor.pdf, Sep. 2010, pp. 1-8.

"Product Overview: Audit-Buddy", http://web.archive.org/web/*/http:/www.comrent.com/images/stories/overviews/Comrent_SO_AuditBuddy_v9.pdf, Published on: Sep. 19, 2015, 2 pages.

Hardjono, et al., "Cloud-Based Commissioning of Constrained Devices using Permissioned Blockchains", In Proceedings of the 2nd ACM International Workshop on IoT Privacy, Trust, and Security, May 30, 2016, pp. 29-36.

Brambley, et al., "Beyond Commissioning: The Role of Automation", In US Department of Energy, Technical Information Service, US Department of Commerce,, Feb. 1, 2005, 18 pages.

Hebert, et al., "Commissioning best practices: Electrical", http://www.csemag.com/single-article/commissioning-best-practices-electrical/12669a628731fe38c0464d4603f19822.html, Published on: Oct. 17, 2012, 4 pages.

"Time Synchronization in Electrical Systems", Retrieved From: https://www.meinbergglobal.com/english/info/time-synchronization-electrical-systems.htm#examples, Nov. 21, 2016, 6 pages.

EXTERNALLY EXPOSING CONNECTIONS TO INTERNAL ELECTRICAL COMPONENTS INSIDE ELECTRICAL SYSTEM EQUIPMENT

CROSS-REFERENCE TO RELATED APPLICATIONS

Not Applicable.

BACKGROUND

1. Background and Relevant Art

When building a new building or data center, building systems, such as, for example, mechanical systems, electrical systems, plumbing systems, and life safety systems, etc., can be commissioned. In general, commissioning building systems insures that the building systems function as intended when released into production.

To commission electrical systems, test devices can be connected to internal power system electrical wiring in pieces of electrical equipment, such as, for example, generators, transformers, switch gear, relays, etc. Panels can be removed from the pieces of electrical equipment to expose internal power system electrical wiring. Interfacing with internal power system electrical wiring inside a piece of electrical equipment poses a risk of electrical shock to human commissioning agents, especially when commissioning higher voltage electrical systems, such as, those used in industrial and data center applications. There is risk of injurious and potentially lethal shock when removing panels to expose and reattaching panels to cover internal power system electrical wiring. There is also risk of injurious and potentially lethal shock when connecting external monitoring/testing devices to and disconnecting external monitoring/testing devices from internal power system electrical wiring.

BRIEF SUMMARY

Examples extend to an apparatus (e.g., a panel or a device) including externally exposed connections (e.g., ports) to internal power system electrical wiring inside a piece of electrical equipment. The externally exposed connections can be on an external surface of the piece of electrical equipment. In one aspect, during manufacture of a piece of electrical equipment, a panel is integrated into an external surface of the piece of electrical equipment. The panel includes one or more ports. Also during manufacture, each of the one or more ports is wired to a portion of internal power system electrical wiring inside the piece of electrical equipment. As such, a commissioning agent (or other personnel) can connect test device wiring to and disconnect test device wiring from the internal power system electrical wiring through the one or more ports. Connecting and disconnecting test device wiring at the one or more ports increases safety. For example, electrical characteristics of electricity on the internal power system electrical wiring can be monitored without having to prop cabinet doors open on, remove panels from, etc. the piece of electrical equipment.

In another aspect, a panel or device is fitted to an external surface of a piece of electrical equipment at a facility. The panel or device includes one or more ports. The piece of electrical system equipment is opened (e.g., open cabinet, remove panel, etc.) to expose internal power system electrical wiring inside the piece of electrical equipment. Each of the one or more ports is wired to a portion of the internal power system electrical wiring. The piece of electrical equipment is then closed to an extent possible. After the piece of electrical equipment is closed up, a commissioning agent (or other personnel) can connect test device wiring to and disconnect test device wiring from the internal power system electrical wiring through the one or more ports. Connecting and disconnecting test device wiring at the one or more ports increases safety. For example, electrical characteristics of electricity on the internal power system electrical wiring can be monitored without having to further prop cabinet doors open on, further remove panels from, etc. the piece of electrical equipment.

A panel or device providing access to internal power system electrical wiring can also include hardware and/or software for facilitating wired and/or wireless network communication. The panel or device can be connected over a wired and/or wireless network connection to one or more of: other panels or devices, testing devices, and a commissioning system used for automated commissioning of electrical systems. In one aspect, a panel or device includes an additional port for a wired network connection (e.g., an Ethernet port).

A panel or device providing access to internal power system electrical wiring can also include connections to internal control systems of a piece of electrical equipment. As such, another panel or device, a testing device, or commissioning system can submit commands to a piece of electrical equipment over a wired and/or wireless network. The commands can be used to control operation of the piece of electrical equipment (e.g., to transition between different test conditions).

The panel or device may also include one or more other ports to directly and externally expose connections to the internal control systems. As such, a (possibly networked) testing device can be locally connected to the one or more other ports to submit commands to the piece of electrical equipment. The commands can be used to control operation of the piece of electrical equipment (e.g., to transition between different test conditions).

In one aspect, connectors on ports at a panel or device are configured for seamless connection with connectors on test device wiring.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by practice. The features and advantages may be realized and obtained by means of the instruments and combinations particularly pointed out in the appended claims. These and other features and advantages will become more fully apparent from the following description and appended claims, or may be learned by practice as set forth hereinafter.

BRIEF DESCRIPTION OF THE DRAWINGS

In order to describe the manner in which the above-recited and other advantages and features can be obtained, a more particular description will be rendered by reference to specific implementations thereof which are illustrated in the appended drawings. Understanding that these drawings depict only some implementations and are not therefore to be considered to be limiting of its scope, implementations will be described and explained with additional specificity and detail through the use of the accompanying drawings in which.

DETAILED DESCRIPTION

Figure 1A:
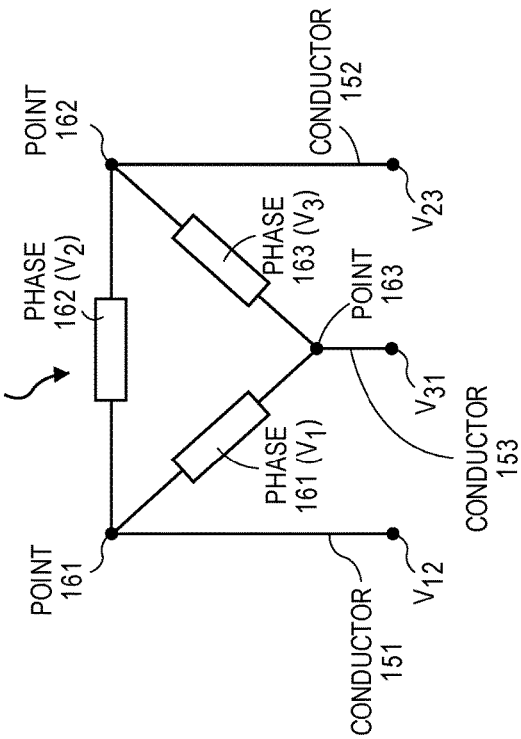
FIG. 1A illustrates an example of three-phase power in a Wye (Y) configuration.

Examples extend to an apparatus (e.g., a panel or a device) including externally exposed connections (e.g., ports) to internal power system electrical wiring inside a piece of electrical equipment. The externally exposed connections can be on an external surface of the piece of electrical equipment. In one aspect, during manufacture of a piece of electrical equipment, a panel is integrated into an external surface of the piece of electrical equipment. The panel includes one or more ports. Also during manufacture, each of the one or more ports is wired to a portion of internal power system electrical wiring inside the piece of electrical equipment. As such, a commissioning agent (or other personnel) can connect test device wiring to and disconnect test device wiring from the internal power system electrical wiring through the one or more ports. Connecting and disconnecting test device wiring at the one or more ports increases safety. For example, electrical characteristics of electricity on the internal power system electrical wiring can be monitored without having to prop cabinet doors open on, remove panels from, etc. the piece of electrical equipment.

In another aspect, a panel or device is fitted to an external surface of a piece of electrical equipment at a facility where the piece of electrical equipment is to be used. The panel or device includes one or more ports. The piece of electrical system equipment is opened (e.g., open cabinet, remove panel, etc.) to expose internal power system electrical wiring inside the piece of electrical equipment. Each of the one or more ports is wired to a portion of the internal power system electrical wiring. The piece of electrical equipment is then closed to an extent possible. After the piece of electrical equipment is closed up, a commissioning agent (or other personnel) can connect test device wiring to and disconnect test device wiring from the internal power system electrical wiring through the one or more ports. Connecting and disconnecting test device wiring at the one or more ports increases safety. For example, electrical characteristics of electricity on the internal power system electrical wiring can be monitored without having to further prop cabinet doors open on, further remove panels from, etc. the piece of electrical equipment.

A panel or device providing access to internal power system electrical wiring can also include hardware and/or software for facilitating wired and/or wireless network communication. The panel or device can be connected over a wired and/or wireless network connection to one or more of: other panels or devices, testing devices, and a commissioning system used for automated commissioning of electrical systems. In one aspect, a panel or device includes an additional port for a wired network connection (e.g., an Ethernet port).

A panel or device providing access to internal power system electrical wiring can also include connections to internal control systems of a piece of electrical equipment. As such, another panel or device, a testing device, or commissioning system can submit commands to a piece of electrical equipment over a wired and/or wireless network. The commands can be used to control operation of the piece of electrical equipment (e.g., to transition between different test conditions).

The panel or device may also include one or more other ports to directly and externally expose connections to the internal control systems. As such, a (possibly networked) testing device can be locally connected to the one or more other ports to submit commands to the piece of electrical equipment. The commands can be used to control operation of the piece of electrical equipment (e.g., to transition between different test conditions).

In one aspect, connectors on ports at a panel or device are configured for seamless connection with connectors on test device wiring.

Implementations may comprise or utilize a special purpose or general-purpose computer including computer hardware, such as, for example, one or more computer and/or hardware processors (including Central Processing Units (CPUs) and/or Graphical Processing Units (GPUs)) and system memory, as discussed in greater detail below. Some computer systems can include and/or be (e.g., network) connected to eye examination devices for examining and/or mapping the human eye. Other devices are also discussed in greater detail below.

Implementations also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations can comprise at least two distinctly different kinds of computer-readable media: computer storage media (devices) and transmission media.

Computer storage media (devices) includes RAM, ROM, EEPROM, CD-ROM, Solid State Drives ("SSDs") (e.g., RAM-based or Flash-based), Shingled Magnetic Recording ("SMR") devices, Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

In one aspect, one or more processors are configured to execute instructions (e.g., computer-readable instructions, computer-executable instructions, etc.) to perform any of a plurality of described operations. The one or more processors can access information from system memory and/or store information in system memory. The one or more processors can (e.g., automatically) transform information between different formats, such as, for example, between any of: commissioning tests, commands, activities, sensed values, commissioning data, pass/fail criteria, forecasted electrical system operation, reports, etc.

System memory can be coupled to the one or more processors and can store instructions (e.g., computer-readable instructions, computer-executable instructions, etc.) executed by the one or more processors. The system memory can also be configured to store any of a plurality of other types of data generated and/or transformed by the described components, such as, for example, commissioning tests, commands, activities, sensed values, commissioning data, pass/fail criteria, forecasted electrical system operation, reports, etc.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that computer storage media (devices) can be included in computer system components that also (or even primarily) utilize transmission media.

Computer-executable instructions comprise, for example, instructions and data which, in response to execution at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the described aspects may be practiced in network computing environments with many types of computer system configurations, including, personal computers, desktop computers, laptop computers, message processors, hand-held devices, wearable devices, multicore processor systems, multi-processor systems, microprocessor-based or programmable consumer electronics, network PCs, minicomputers, mainframe computers, mobile telephones, PDAs, tablets, routers, switches, and the like. The described aspects may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. In another example, computer code is configured for execution in one or more processors, and may include hardware logic/electrical circuitry controlled by the computer code. These example devices are provided herein purposes of illustration, and are not intended to be limiting. Embodiments of the present disclosure may be implemented in further types of devices.

The described aspects can also be implemented in cloud computing environments. In this description and the following claims, "cloud computing" is defined as a model for enabling on-demand network access to a shared pool of configurable computing resources. For example, cloud computing can be employed in the marketplace to offer ubiquitous and convenient on-demand access to the shared pool of configurable computing resources (e.g., compute resources, networking resources, and storage resources). The shared pool of configurable computing resources can be provisioned via virtualization and released with low effort or service provider interaction, and then scaled accordingly.

A cloud computing model can be composed of various characteristics such as, for example, on-demand self-service, broad network access, resource pooling, rapid elasticity, measured service, and so forth. A cloud computing model can also expose various service models, such as, for example, Software as a Service ("SaaS"), Platform as a Service ("PaaS"), and Infrastructure as a Service ("IaaS"). A cloud computing model can also be deployed using different deployment models such as private cloud, community cloud, public cloud, hybrid cloud, and so forth. In this description and in the following claims, a "cloud computing environment" is an environment in which cloud computing is employed.

In this description and the following claims, "polyphase electrical power" is defined as electrical power having a plurality of energized electrical conductors (e.g., two, three, four, etc.) carrying alternating currents with a defined time offset between the voltage waves in each conductor.

In this description and the following claims, "three-phase electrical power" is defined as electrical power having three energized electrical conductors (a "3-wire configuration") carrying alternating currents with a defined time offset between the voltage waves in each conductor. For symmetric three-phase electrical power, each of three conductors can carry alternating current (AC) of the same frequency and voltage amplitude relative to a common reference but with a phase difference of one-third the period. The common reference can be connected to ground and/or can be connected to a current-carrying conductor (e.g., the neutral).

Due to the phase difference, the voltage on any conductor reaches its peak at one third of a cycle after one of the other conductors and one third of a cycle before the remaining conductor. The phase delay gives constant power transfer to a balanced linear load. Three-phase electrical power can be connected in a variety of different ways, including: a Wye (Y) (or "star") configuration, a Delta (Δ) configuration, etc.

In this description and the following claims, "a wye (Y) (or "star") connection" is defined as a connection where one end of a conductor for each phase are commonly connected together. FIG. 1A illustrates an example of three-phase power in a Wye (Y) configuration 100. As depicted, conductor (line) 101 corresponds to phase 111, conductor (line) 102 corresponds to phase 112, and conductor (line) 103 corresponds to phase 112. Conductors (lines) 101, 102, 103, and optional neutral 104 are connected to common neutral point 106. For a generator, each conductor (line) 101, 102, and 103 produces equal voltage magnitudes at phase angles equal spaced from each other (i.e., separated by 120°). Equations 121, 122, and 123 define voltages at conductors (lines) 101, 102, and 103. $V_1$ is a reference with $V_3$ lagging $V_2$ lagging $V_1$. $V_{LN}$ is line voltage.

Figure 1B:
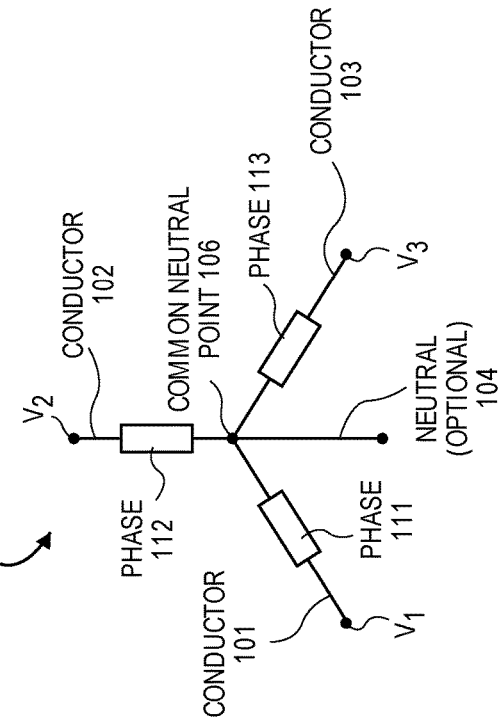
FIG. 1B illustrates an example of three-phase power in a Delta (Δ) configuration.

In this description and the following claims, "a delta (Δ) connection" is defined as a connection where, per phase, each end of a conductor for the phase is connected to an end of a conductor for each of the other phases. That is, loads are connected across the lines, and so loads see line-to-line voltages. FIG. 1B illustrates an example of three-phase power in a Delta (Δ) configuration 150. As depicted, one end of phase 161, one end of phase 162, and conductor 151 are connected at point 161. Similarly, one end of phase 163, one end of phase 163, and conductor 152 are connected at point 162. Likewise, one end of phase 161, one end of phase 163, and conductor 153 are connected at point 163.

As described for Delta (Δ) configurations, loads are connected across the lines, and so loads see line-to-line voltages. Equation 171 defines voltage $V_{12}$ (at point 161), equation 172 defines voltage $V_{23}$ (at point 162), and equation 173 defines voltage $V_{31}$ (at point 163).

Both a delta (Δ) connection and a wye (Y) connection can be arranged in a "4-wire" configuration wherein a fourth wire is provided as a neutral and can be grounded. "3-wire" and "4-wire" configurations can also include a ground wire for fault protection.

Power Transmission and Distribution

In this description and the following claims, "electric power transmission" is defined as bulk movement of electrical energy (e.g., three-phase power) from a generating site (e.g., a power plant) to an electrical substation. Interconnected lines which facilitate transmission of electrical energy are known as a transmission network. Power can be transmitted at various voltages. At power stations, power is produced at a relatively low voltage between about 2.3 kV AC and 30 kV AC, depending on the size of the unit. The generator terminal voltage is then stepped up by the power station transformer to a higher voltage (e.g., 110 kV AC to 765 kV AC, varying by the transmission system and by the country) for transmission over long distances. In the United States, power transmission is, variously, 230 kV to 500 kV AC, (e.g., 230 kV AC, 345 kV AC, etc.) with less than 230 kV AC (e.g., 115 kV AC, 138 kV AC, 161 kV AC) or more than 500 kV AC being local exceptions. Voltages over 765 kV AC can utilize different designs compared to equipment used at lower voltages.

In this description and the following claims "electric power distribution" is defined as the movement electrical energy (e.g., three-phase power) from an electrical substation to customers. Interconnected lines which facilitate distribution of electrical energy are known as a distribution network. Distribution substations connect to a transmission system (or subtransmission system) and lower the transmission voltage to medium voltage ranging, for example, between 2 kV AC and 35 kV AC, with the use of transformers.

Primary distribution lines carry this medium voltage power to distribution transformers located near the customer's premises. Distribution transformers again lower the voltage to the utilization voltage of household appliances and typically feed several customers through secondary distribution lines at this voltage. Commercial and residential customers are connected to the secondary distribution lines through service drops. Customers demanding a larger amount of power, for example, for industrial or data center applications, may be connected directly to the primary distribution level or the subtransmission level.

Subtransmission (e.g., of three-phase power) is part of an electric power transmission system that runs at relatively lower voltages. It may be uneconomical to connect all distribution substations to the higher main transmission voltage, because the equipment is larger and more expensive. Typically, only larger substations connect with this high voltage. It can then be stepped down and sent to smaller substations in towns and neighborhoods.

There is no fixed cutoff between subtransmission and transmission, or between subtransmission and distribution. The voltage ranges can overlap. Voltages of 69 kV AC, 115 kV AC, and 138 kV AC are sometimes used for subtransmission in North America. As power systems have evolved, voltages formerly used for transmission were transitioned for subtransmission, and voltages formerly used for subtransmission were transition for distribution voltages. Like transmission, subtransmission can move relatively large amounts of power, and like distribution, subtransmission can cover an area instead of just point to point. At the substations, transformers reduce the voltage to a lower level for distribution to commercial and residential users. This distribution can be accomplished with a combination of subtransmission (33 kV AC to 132 kV AC) and distribution (3.3 kV AC to 33 kV AC).

At the point of use, the electrical energy (e.g., three-phase power) is transformed to lower voltage, for example, "Mains electricity" (varying by country and customer requirements). Most of the Americas use 60 Hz AC, the 120/240 volt split phase system domestically and three phase for larger installations.

In this description and the following claims, the "power grid" or simply the "grid" is defined as a combined transmission network (including any optional subtransmission networks) and distribution network.

Figure 2:
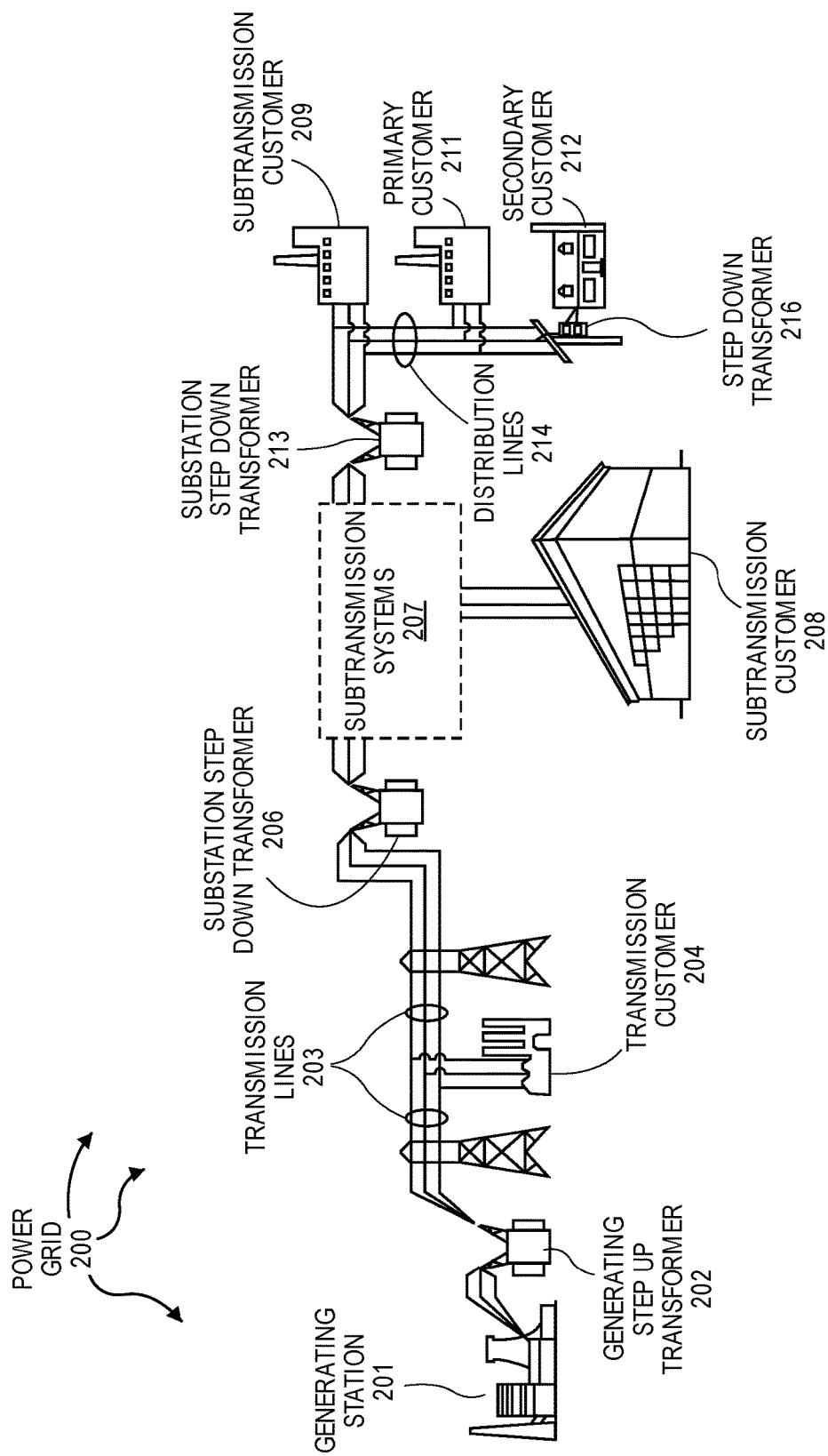
FIG. 2 illustrates an example power system grid including power transmission and power distribution.

FIG. 2 illustrates an example power system grid 200 including power transmission and power distribution (e.g., of three-phase power). Generating station 201 generates power in the 2.3 kV AC to 30 kV AC range. Generating step up transformer 202 steps the voltage up from the 2.3 kV AC to 30 kV AC range to a more suitable transmission voltage, such as, for example, to 765 kV AC, 500 kV AC, 345 kV AC, 230 kV AC, or 138 kV AC, for transmitting power over transmission lines 203.

Transmission customer 204 can access the transmitted power from transmission lines 203. Transmission customer 204 can include additional transformers and other electrical equipment and/or power system equipment for utilizing transmission range voltages (e.g., 110 kV AC to 765 kV AC). Transmission customer 204 may represent an interconnection between a grid containing generating station 201 and some other grid. For example, in North America transmission customer 204 can represent an interconnection between any of: the Eastern Grid, the Western Grid, and the Texas (ERCOT) Grid, the Alaska Grid, and the Quebec Grid.

Substation step down transformer 206, for example, in subtransmission systems 207, can step down the transmission voltage to a voltage in the range of 33 kV AC to 132 kV AC. Voltage in the range of 33 kV AC to 132 kV AC can be transmitted over transmission lines within subtransmission systems 207. In one aspect, multiple subtransmissions systems transmit different voltages. The voltages can be progressively stepped down as equipment is physically located closer to residential and commercial end users. Subtransmisson customer 208 (e.g., a data center or industrial user) can access the transmitted power from transmission lines. Subtransmission customer 208 can include additional transformers and other electrical/power system equipment for utilizing voltages in the 26 kV AC to 132 kV AC range.

Substation step down transformer 213 can further step down voltages transmitted through subtransmission systems 207 to a voltage in the range of 4 kV AC to 69 kV AC for distribution on distribution lines 214. Subtransmission customer 209 (e.g., an industrial or data center customer) can access the distributed power from distribution lines 214. Subtransmission customer 209 can include additional transformers and other electrical/power system equipment for utilizing voltages in the 26 kV AC to 69 kV AC range. Primary customer 211 can also access the distributed power from distribution lines 214. Primary customer 211 can include additional transformers and other electrical/power system equipment for utilizing voltages in the 4 kV AC to 13 kV AC range.

Step down transformer 216 can further step down voltages on distribution lines 214 for commercial and/or residential use. For example, step down transformer 216 can step down voltages on distribution line 214 to 240V AC (and/or 120V AC). Secondary customer 212 (e.g., a residence) can access the 240V AC (and/or 120V AC) from step down transformer 216.

Building System Commissioning

When constructing a building or data center, mechanical, electrical, plumbing, and life safety systems are designed to operate in an intended manner when released into production. However, there is no way to insure that a particular system operates in an intended manner until the system is actually constructed. Even the best designs may not be realized in a system that operates as intended. As such, a commissioning process for individual building systems can be used to validate building system performance prior to production release of the building system (e.g., prior to turning the building over to an owner, allowing the building to be used for an intended purpose, such as, housing servers, etc.). Thus, commissioning various building systems insures that the building systems function as intended when released into production.

Commissioning processes have remained largely static over the last half century. Commissioning a building system includes developing a commissioning plan. Human commissioning agents review and comment on the plan. Commissioning test scripts are developed and reviewed. A construction QA/QC process is witnessed and equipment is inspected. An installer or manufacturer starts up the equipment. A commissioning team (of human commissioning agents) connects test devices to the equipment. The commissioning team operates the equipment through various conditions. The commission team gathers data and, from the data, determines if the building system passes or fails. The commissioning team can generate and submit a report of their findings.

There are a number of issues with the current manually intensive process for building system commissioning. Many of the issues relate to safety, human error, and efficiency. Commissioning Agents are human which can cause safety issues and inconsistent results across the program. Issues include, but are not limited to, (1) errors and non-standardization in test development, (2) errors in equipment inspection, (3) errors in test execution and performing testing processes, (4) errors when collecting and analyzing results, (5) errors in report preparation, and (6) errors when explaining results.

More specifically, commissioning electrical systems in industrial/commercial settings, such as, for example, in data centers, can increase the likelihood that the electrical system functions as intended when released into production. Electrical system commissioning can include human commissioning agents physically going to various different pieces of electrical equipment (e.g., transformers, generators, switch gear, relays, circuit breakers, bus bars, batteries, alternators, equipment (e.g., server) racks, etc.) of the electrical system. The commissioning agents can attempt record electrical characteristics (e.g., voltage changes, current changes, transients, harmonics, ground faults, short circuits, etc.) of the electrical equipment under different test conditions (e.g., energized from utility, energized from generator, switching from utility to generator, switching from generator to utility, different loads, etc.).

Similar to other types of commissioning, when commissioning an electrical system, any results are subject to human error. Electrical system commissioning is also human capital intensive since a large number of commissioning agents may be required.

Additionally, when commissioning electrical system equipment, such as, for example, when working with electrical and energy isolation, various safety considerations also arise. There is a safety risk when connecting test devices to electrical system equipment. There is a safety risk when operating electrical system equipment. There is a safety risk when removing testing devise from electrical system equipment.

As such, many electrical system commissioning activities are dangerous and/or are considered High Risk Activities ("HRAs") due to the voltages under test (e.g., up to 10s of thousands of volts). A human commissioning agent is often required to open (e.g., remove protective panels on) electrical equipment to access internal electrical connections. The electrical connections can remain exposed while commissioning tests are performed. For example, it might not be possible to reattach protective panels prior to testing due to wires going from inside equipment to connected test devices.

The voltages present in industrial applications, data centers, etc. pose an increased risk of injurious and potentially lethal shock if mistakes are made during commissioning. For example, difficulty breathing, pain, and muscle paralysis can occur when a person receives a shock between 10 milliamps and 100 milliamps. Increased risk of ventricular fibrillation (resulting in death) can occur when a person receives a shock between 100 milliamps and 200 milliamps Severe burns and breathing cessation (resulting in death) can occur when a person receives a shock over 200 milliamps.

Automated Electrical System Commissioning

In one aspect, a commissioning center computer system is connected to a plurality of automated data collection devices over a network (e.g., wired or wireless) to form a commissioning automation network (CAN). A CAN can be a temporary network deployed to support commissioning activities through applying automation to the commissioning process. Deploying a CAN can include deploying automation software to control and monitor multiple pieces of electrical equipment as well as deploying test equipment, data loggers, cameras, condensers (microphones), etc. Outputs from test equipment, data collection devices, cameras, condensers, etc. can be delivered over a wired and/or wireless network for rendering at a commissioning center computer system.

Each of a plurality of automated data collection devices can collect data related to electrical system commissioning. Some devices are electrically connected to electrical system equipment and others monitor environmental conditions related to electrical system functionality. Devices connected to electrical system equipment can collect data related to electrical characteristics of the equipment (voltage changes, current changes, transients, harmonics, ground faults, short circuits, etc.). Devices monitoring environmental conditions can collect data, such as, for example, heat, temperature, humidity, barometric pressure, etc. in environments around pieces of electrical equipment. Other devices, such as, cameras and condensers can capture video and audio in environments around electrical equipment.

Commissioning automation software at the commissioning center computer system collects data from each of the automated data collection devices over the network. The data can be used to automatically establish pass/fail for various commissioning tests (without a human being near potentially dangerous electrical equipment). The data can also be stored in a database for subsequent analysis (e.g., used by Operations teams, used to tailor subsequent commissioning tests, sent to commissioning supervisors, etc.). Once the data is stored, analysis possibilities are very diverse.

In another aspect, a commissioning center computer system provides collected data and test results to a commissioning agent or other user through a user-interface. The commissioning agent or other user can view collected data and test results in essentially real-time and make decisions (e.g., start other tests, sign-off, etc.) through the user-interface based on the collected data and test results.

An electrical system commissioning process can be highly (e.g., potentially fully) automated by integrating data collection, control, analysis and reporting of the testing and results. Commissioning Automation Testing software (CATS) can operate over a CAN to control, monitor and record the test equipment as well as some of the building infrastructure. Results are captured and analyzed by the CATS. Results that fall outside of the acceptable parameters can be reported as a failed condition by the software.

By using automation software, pre-set equipment performance parameters can be selected. When running the tests, CATS can gather the data, analyze the results, compare against the pre-set pass fail criteria, and automatically generate a pass fail report. This provides real time analysis of the results. CATS can control and monitor the electrical equipment under test, capture the data, analyze the results, and then place the required data and results in a final report. Automating data capture and analysis drastically reduces the time the required for a Commissioning Agent to download the data, analyze the data, and decide what data needs to go into a commissioning report.

When testing a large Data Center 100,000s of data points can be collected. Automation and (big) data analysis can be used to identify trends in collected data. By capturing data and storing data in a (potentially distributed) database, the data can be analyzed using (big) data business intelligence tools.

CATS can also integrate building systems and commissioning equipment to a single platform. By running commissioning tests through automated software, safety is increased by ensuring the tests are run the same way reducing the likelihood of human error as well as removing the operator from some of the hazards during the testing. By connecting commissioning equipment and installed electrical equipment, many data points (e.g., millions) are captured and (e.g., near) real-time performance analysis of performance can be realized. When analysis is completed and pass fail conditions are reported, a commissioning center computer system can automatically generate a commissioning report.

Accordingly, aspects of the invention include automatically commissioning an electrical system in industrial/commercial settings (e.g., a data center) to increase the likelihood that the electrical system functions as intended when released into production. Automated data collection devices can collect commissioning data related to electrical and other characteristics of electrical equipment. Automation software can access commissioning data from the automated data collection devices over a computer network. The commissioning data can be stored in a database for analysis. The commissioning data can be compared to pass/fail criteria. A commissioning report can be generated.

In other aspects, a commissioning center computer system controls and monitors electrical equipment being commissioned. In an automated fashion, the commissioning center computer system captures commissioning data, analyzes results, places the commissioning data in a database, and generates reports. The commissioning center computer system can send commands to automated data collection devices to perform various commissioning activities, for example, run a specific script, perform a commissioning test or tests on a piece of electrical equipment, etc.

In one aspect, if commissioning data for a piece of electrical equipment does not satisfy pass/fail criteria, a commissioning system computer system automatically sends commands to automated data collection devices to perform additional commissioning activities.

Figure 3:
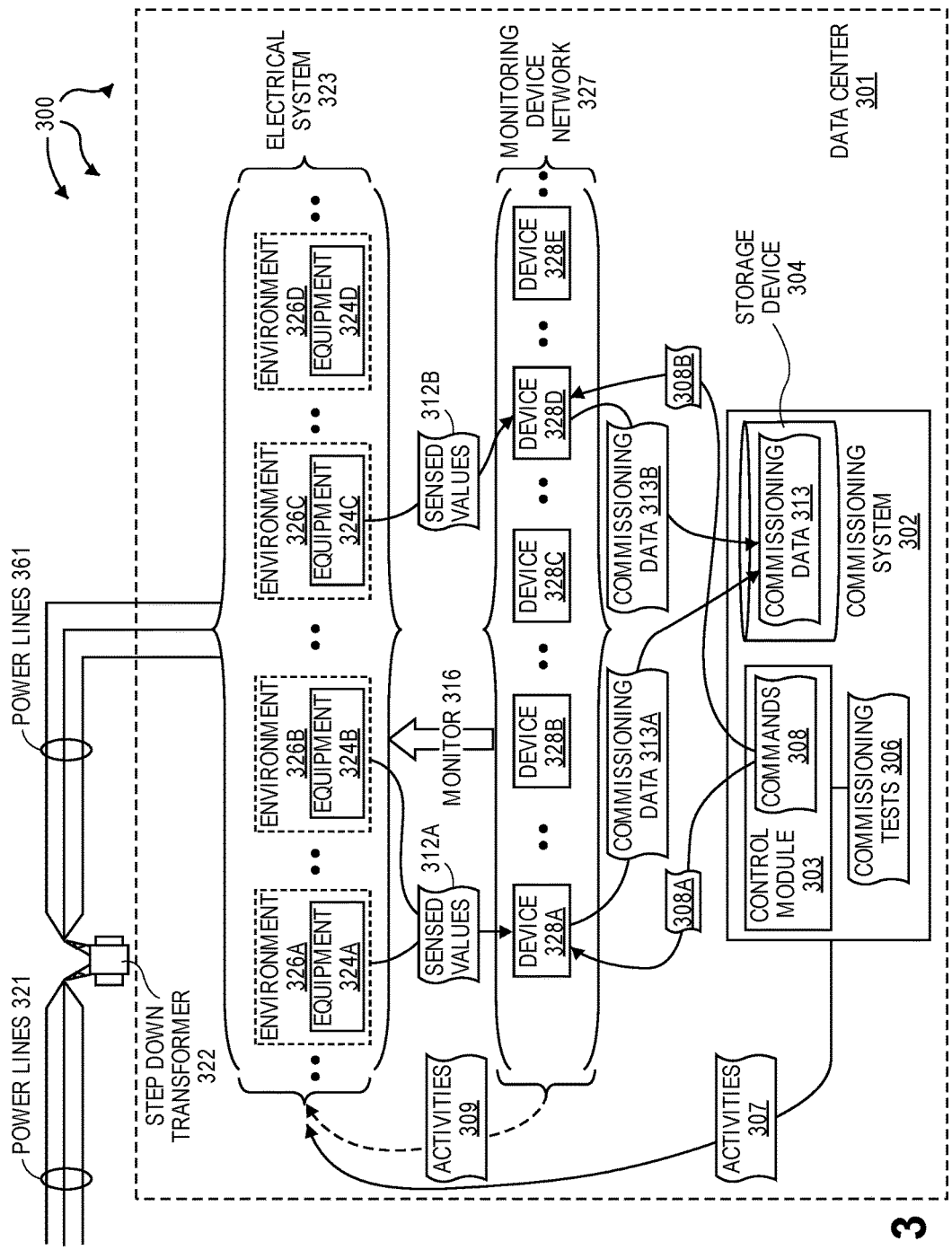
FIG. 3 illustrates an example architecture that facilitates automated electrical system commissioning.

FIG. 3 illustrates an example architecture that facilitates automated electrical system commissioning. Referring to FIG. 3, architecture 300 includes power lines 321, step down transformer 322, power lines 361, electrical system 323, monitoring device network 327, and commissioning system 302. Power lines 321, step down transformer 322, power lines 361, electrical system 323, monitoring device network 327, and commissioning system 302 can be connected to (or be part of) a network, such as, for example, a system bus, a Local Area Network ("LAN"), a Wide Area Network ("WAN"), and even the Internet. Accordingly, power lines 321, step down transformer 322, power lines 361, electrical system 323, monitoring device network 327, and commissioning system 302 as well as any other connected computer systems and their components can create and exchange message related data (e.g., Internet Protocol ("IP") datagrams and other higher layer protocols that utilize IP datagrams, such as, Transmission Control Protocol ("TCP"), Hypertext Transfer Protocol ("HTTP"), Simple Mail Transfer Protocol ("SMTP"), Simple Object Access Protocol (SOAP), etc. or using other non-datagram protocols) over the network.

Power lines 321, step down transformer 322, and power lines 361 can be included in power transmission and/or distribution system that is external to data center 301. Power lines 321 can be carrying three-phase power at a first voltage (e.g., in a range between 33 kV AC to 132 kV AC). Step down transformer 322 can step down the three-phase power at the first voltage to three-phase power at a second lower voltage (e.g., in a range between 3.3 kV AC to 33 kV AC). Power lines 361 can carry the three-phase power at the second lower voltage into data center 301.

Electrical system 323, monitoring device network 327, and commissioning system 302 can be included in data center 301. Power lines 321 and step down transformer 322 can be under the control of a first entity (e.g., a power or utility company) and data center 301 can be under the control of second different entity (e.g., a different business). Power lines 361 may be under the control of either the first or second entity depending on a power distribution arrangement between the first and second entities. Power lines 321 and/or step down transformer 322 can be part of a substation, which may or may not be physical located on property under the control of the second entity. Power lines 361 can be fully physically located on property under the control of the second entity or partially physically located on property under the control of the second entity and partially physically located on other property (e.g., depending on the location of a substation).

During design of data center 301, a designer (e.g., owner) can desire for electrical system 323 to operate in an intended manner. For example, the designer can desire for electrical system 323 to safely provide a stable power source for servers installed (e.g., in server racks) at data center 301 under a variety of different operating conditions. The variety of different operating conditions can include, but are not limited to, energized from utility, energized from generator, switching from utility to generator, switching from generator to utility, different loads, etc.

As depicted, electrical system 323 includes pieces of electrical equipment 324A-324D operating in environments 326A-326D respectively. Electrical equipment 324A-324D can include any of a variety of different types of electrical/power system equipment, such as, for example, transformers (e.g., additional step down transformers), generators, switch gear, relays, circuit breakers, bus bars, batteries, alternators, server racks, etc. A number of other pieces of electrical equipment, in addition to electrical equipment 324A-324D, can also be included in electrical system 323. As such, electrical system 323 can include hundreds, thousands, or even tens of thousands of pieces of electrical equipment.

Electrical system 323 can be part of a power system infrastructure for powering data center 301.

Monitoring device network 327 includes devices 328A-328E. Devices in monitoring device network 327 can be configured to monitor electrical characteristics of electrical equipment in electrical system 327 as well as monitor other (e.g., environmental) characteristics associated with the operation of electrical equipment in electrical system 327. A number of other monitoring devices, in addition to devices 328A-328E, can also be included in monitoring device network 327. As such, monitoring device network 327 can include hundreds, thousands, or even tens of thousands of monitoring devices.

Devices in monitoring device network 327 can be connected to commissioning system 302, and possibly to one another (e.g., in a mesh network or star network arrangement), via wired and/or wireless computer network connections. Devices in monitoring device network 327 can also include sensors and, when appropriate, other relevant connections for collecting commissioning data from monitored pieces of electrical system equipment and monitored environments.

For example, some devices in monitoring device network 327 can be electrically connected to conducting wires inside pieces of electrical equipment. These devices can include sensors for sensing electrical characteristics of electricity on the conducting wires under different test conditions (e.g., energized from utility, energized from generator, switching from utility to generator, switching from generator to utility, different loads, etc.). Sensed electrical characteristics can include voltage changes, current changes, transients, harmonics, ground faults, short circuits, etc., under one or more of the different test conditions. These devices can also include computing resources (software and/or hardware) for transforming, converting, etc. sensed electrical characteristics into commissioning data indicative of the sensed electrical characteristics.

Other devices in monitoring device network 327 can monitor environmental conditions around pieces of electrical equipment under different test conditions (e.g., energized from utility, energized from generator, switching from utility to generator, switching from generator to utility, different loads, etc.). Sensed environmental conditions can include heat, temperature, humidity, barometric pressure, etc., under one or more of the different test conditions. These devices can also include computing resources (software and/or hardware) for transforming, converting, etc. sensed environmental conditions into commissioning data indicative of the sensed environmental conditions.

In one aspect, multiple devices can be used to monitor different characteristics/conditions associated with a piece of electrical equipment. For example, device 328A can be electrically connected to conducting wires within equipment 324A to monitor electrical characteristics of electricity on the conducting wires. Device 328B can be placed in environment 326A to monitor environmental conditions around equipment 324A. Under one or more different test conditions, device 328A can monitor electrical characteristics of electricity on the conducting wires of equipment 324A along with device 328B monitoring environmental conditions in environment 326A. Device 328A can also include computing resources (software and/or hardware) for transforming, converting, etc. sensed electrical characteristics on the conducting wires within equipment 324A into corresponding commissioning data indicative of the sensed electrical characteristics. Device 328B can also include computing resources (software and/or hardware) for transforming, converting, etc. the sensed environmental conditions in environment 326A into commissioning data indicative of the sensed environmental conditions.

Alternately, multiple devices can be electrically connected to conducting wires within equipment to monitor different electrical characteristics. For example, both device 328C and 328D can be electrically connected to conducting wires within equipment 324B. Under one or more different test conditions, each of devices 328C and 328D can monitor different electrical characteristics of electricity on the conducting wires. For example, device 328C can monitor voltage and current while device 328D monitors harmonics. These devices can also include computing resources (software and/or hardware) for transforming, converting, etc. sensed electrical characteristics on the conducting wires within equipment 324B into commissioning data indicative of the sensed electrical characteristics.

In an additional alternative, multiple devices can be used to monitor environmental conditions around a piece of electrical equipment. For example, both device 328B and 328E can be placed in environment 326B. Under one or more different test conditions, each of devices 328B and 328E can monitor different environmental conditions in environment 326B. For example, device 328B can monitor temperature and device 328E can monitoring humidity. These devices can also include computing resources (software and/or hardware) for transforming, converting, etc. sensed environmental conditions in environment 326B into commissioning data indicative of the sensed environmental conditions.

In another aspect, a device can be used to monitor characteristics and/or conditions associated with multiple pieces of electrical equipment. A device can include multiple sensors can that be placed in different locations. For example, device 328B may include multiple temperature sensors. Once sensor can be placed in environment 326C and another sensor can be placed in environment 326D. Under one or more different test conditions, device 328B can monitor temperature in both environment 326C and environment 326D. Device 328B can also include computing resources (software and/or hardware) for transforming, converting, etc. sensed environmental conditions within each of environments 326C and 326D into commissioning data indicative of the sensed environmental conditions.

Alternatively, device 328C include multiple connections and sensors for monitoring voltage. Device 328C can be electrically connected to conducting wires within both equipment 324C and equipment 324D. Under one or more different test conditions, devices 328C can monitor the voltage of electricity on both the conducting wires within equipment 324C and the conducting wires within equipment 324D. Device 328C can also include computing resources (software and/or hardware) for transforming, converting, etc. sensed voltages on the conducting wires within equipment 324C and the conducting wires within equipment 324D into commissioning data indicative of the sensed environmental conditions indicative of the sensed voltages.

Other combinations and device arrangements (1-N, N-1, N-M, M-N, etc.) are also possible for monitoring both electrical characteristic and environmental conditions. In general, device arrangements and combinations can be tailored to capture commissioning data relevant to an electrical system being commissioned.

As depicted, commissioning system 302 includes control module 303, storage device 304, and commissioning tests 306. In general, control module 303 can send commands to devices in monitoring device network 327 over a wired or wireless computer network. The commands can instruct devices to monitor and capture commissioning data for equipment and environments within electrical system 323.

In some aspects, control module 303 can also perform activities within an electrical system 323 to change test conditions. In other aspects, control module 303 sends commands to devices in monitoring device network 327. The monitoring devices then perform activities within an electrical system 323 to change test conditions. In further aspects, test conditions can be changed by a human commissioning agent or other personnel.

Commissioning data captured at devices in monitoring device network 327 can be sent to commissioning system 302 over a computer network. Commissioning system 302 can receive the commissioning data from monitoring device network 327. Commission system 302 can store the commissioning data at storage device 304 (e.g., at a database).

Figure 4A:
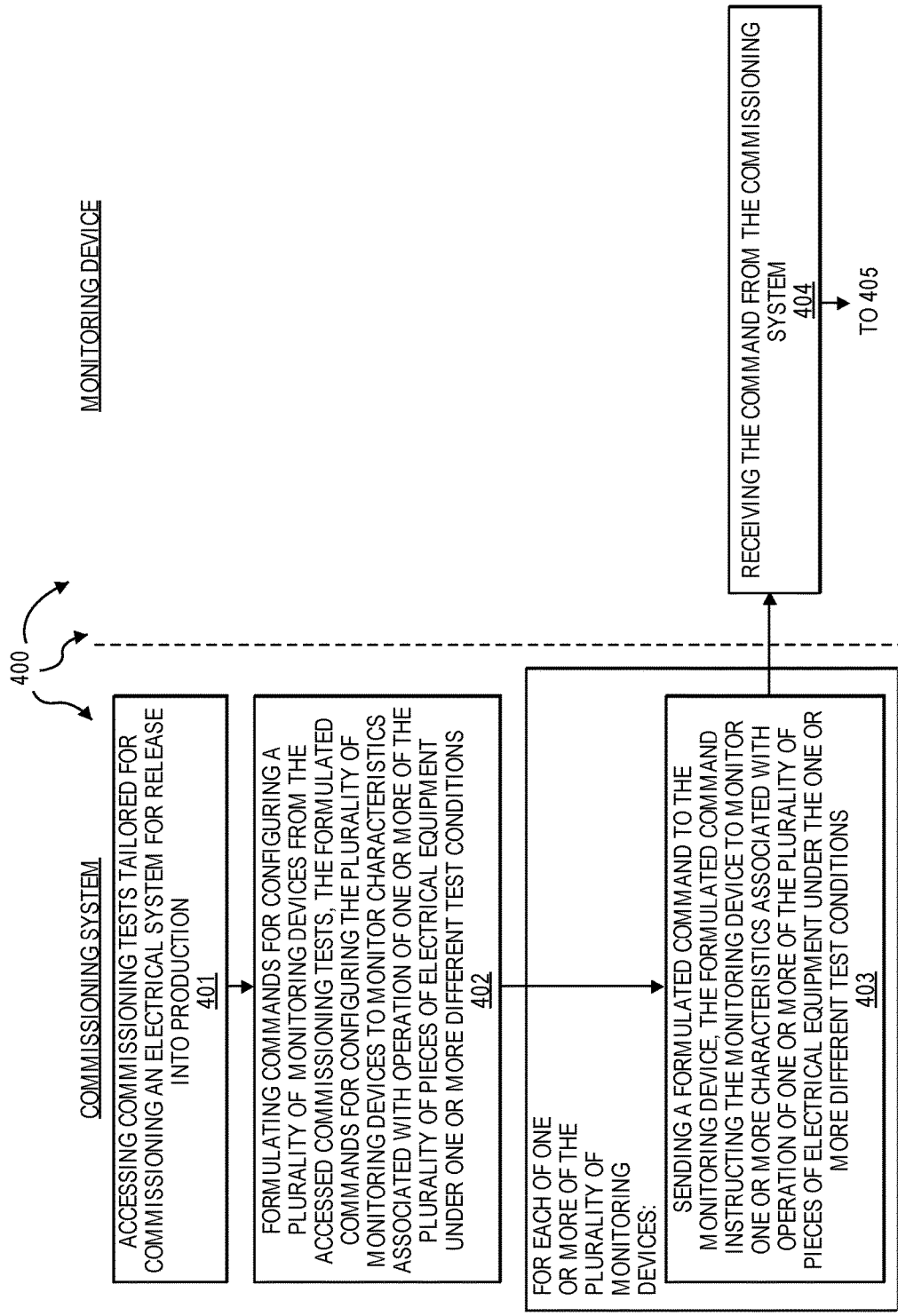
FIGS. 4A and 4B illustrate a flow chart of an example method for acquiring commissioning data.
Figure 4B:
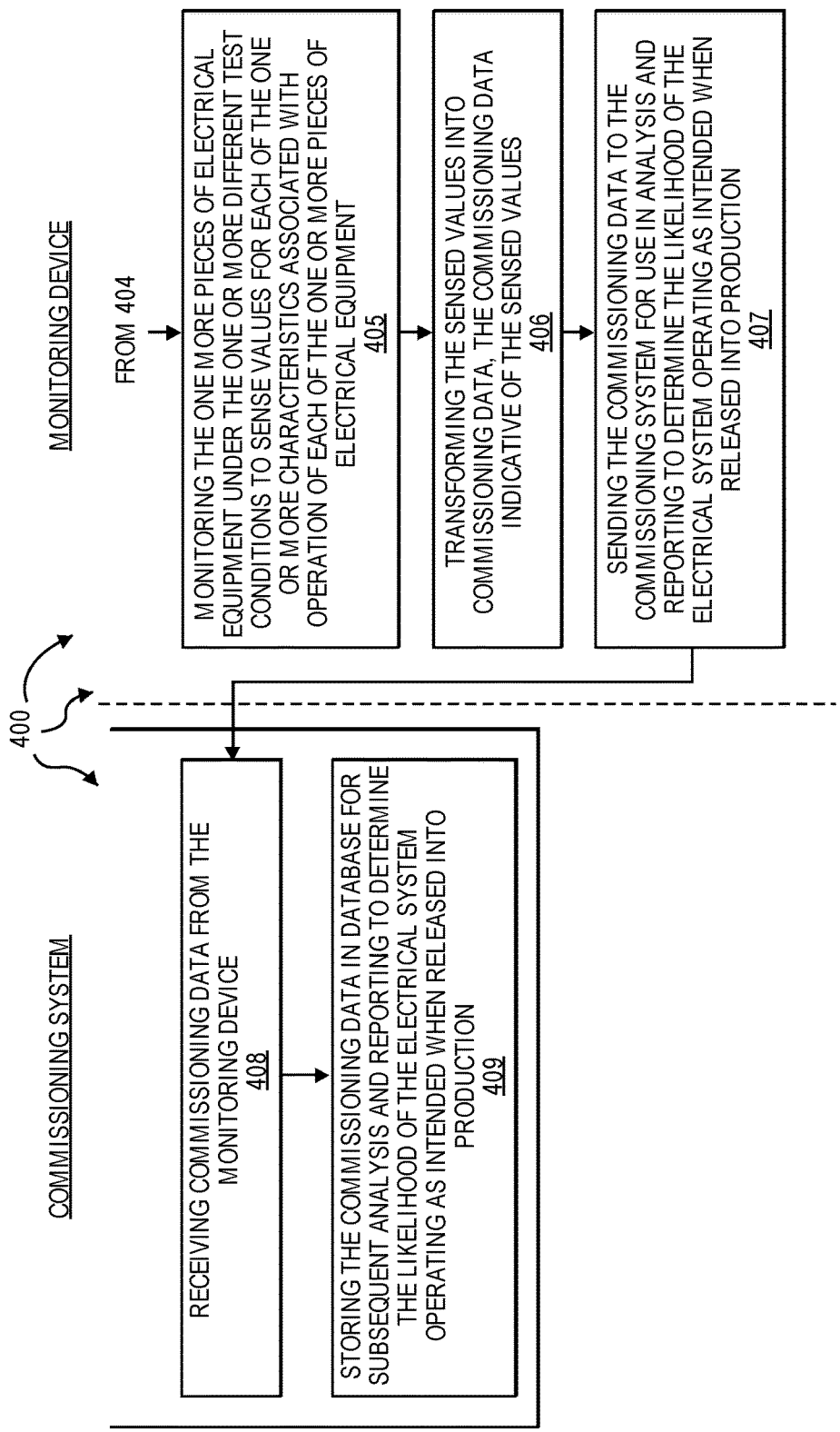

FIGS. 4A and 4B illustrate a flow chart of an example method 400 for acquiring commissioning data. Method 400 will be described with respect to the components and data of architecture 300.

An operator of commissioning system 302 (e.g., a commissioning agent) may desire to commission electrical system 323 for release into production. The operator can enter commands into commissioning system 302 through a (e.g., graphical) user-interface. In response, commissioning system 302 can attempt to commission electrical system 323.

Method 400 includes accessing commissioning tests tailored for commissioning an electrical system for release into production (401). For example, control module 303 can access commissioning tests 306. Commissioning tests can be tailored (e.g., by a commissioning agent) for commissioning electrical system 323. That is, commissioning tests 306 can be specifically configured to commission types of electrical equipment and environments included in electrical system 323. Control module 303 can access commissioning tests 306 from a durable storage device or from system memory at commissioning system 302.

Method 400 includes formulating commands for configuring a plurality of monitoring devices from the accessed commissioning tests, the formulated commands for configuring the plurality of monitoring devices to monitor characteristics associated with operation of one or more of the plurality of pieces of electrical equipment under one or more different test conditions (402). For example, control module 303 can formulate commands 308 from commissioning tests 306. Commands 308 can be for configuring a plurality of devices in monitoring device network 327 to monitor characteristics associated with operation of electrical equipment in electrical system 323. Monitoring can occur under one or more different test conditions (e.g., energized from utility, energized from generator, switching from utility to generator, switching from generator to utility, different loads, etc.).

For each of the one or more of the plurality of monitoring devices, method 400 includes sending a formulated command to the monitoring device, the formulated command instructing the monitoring device to monitor one or more characteristics associated with operation of one or more of the plurality of pieces of electrical equipment under the one or more different test conditions (403). For example, control module 303 can send command 308A (from commands 308) to device 328A. Command 308A can instruct device 328A to monitor humidity in environments 326A and 326B under the one or more different test conditions. Similarly, control module 303 can send command 308B (from commands 308) to device 328D. Command 308B can instruct device 328D to monitor voltage and current of electricity on conducting wires inside equipment 324C under the one or more different test conditions.

Method 400 includes receiving the command from the commissioning system (404). For example, device 328A can receive command 308A from control module 303. Similarly, device 328D can receive command 308 B from control module 303.

Method 400 includes monitoring the one more pieces of electrical equipment under the one or more different test conditions to sense values for each of the one or more characteristics associated with operation of each of the one or more pieces of electrical equipment (405). For example, device 328A can monitor environments 326A and 326B to sense humidity values 312A in environments 326A and 326B during operation of equipment 324A and 324B under the one or more different test conditions. Similarly, device 328D can monitor conducting wires inside equipment 324C to sense voltage and current values 312B of electricity on the conducting wires under the one or more different test conditions.

Other commands from commands 308 can be sent to and received at other devices (e.g., device 328B, 328C, 328D, etc.) in monitoring device network 327. The other commands can instruct the other devices to monitor other characteristics associated with the operation of equipment 324A-324D under the one or more different test conditions. Thus, in general, monitoring device network 327 can monitor 310 electrical systems 323 under the one or more different test conditions.

Different test conditions within data center 301 can be cycled by commissioning agents or in an automated manner by a combination of commissioning system 302 and/or monitoring device network 327. For example, a commission agent can switch some or all of electrical system 323 from generator to utility power or vice versa. Alternately, control module 303 can send activities 307 to electrical system 323 to switch some or all of electrical system 323 from generator to utility power or vice versa. In a further alternative, devices in monitoring device network 327 can send activities 309 switch some or all of electrical system 323 from generator to utility power or vice versa. Other transitions between different test conditions within data center 301, for example, changing loads on parts of electrical system 323, can be similarly facilitated.

Commissioning data can be collected under one test condition, the test conditions changed, and commissioning data again collected. Testing conditions can be changed multiple times and commissioning data collected for each test condition. In one aspect, commissioning data is collected when electrical system 323 is under each of a plurality of different loads. In another aspect, commissioning data is collected when electrical system 323 is energized from utility, during transition of electrical system 323 from utility to generator, when electrical system 323 is energized from generator, and during transition of electrical system 323 from generator to utility. Looping behavior can be implemented, wherein different commissioning data is collected on each loop iteration.

Method 400 includes transforming the sensed values into commissioning data, the commissioning data indicative of the sensed values (406). For example, device 328A can transform sensed values 312A into commissioning data 313A. Similarly, device 328D can transform sensed values 312B into commissioning data 313B.

Method 400 includes sending the commissioning data to the commissioning system for use in analysis and reporting to determine the likelihood of the electrical system operating as intended when released into production (407). For example, device 328A can send commissioning data 313A to commissioning system 302. Similarly, device 328D can send commissioning data 313B to commissioning system 302. Commissioning data 313A and 313B can be used for determining the likelihood of electrical system 323 operating as intended when released into production.

For each of the one or more of the plurality of monitoring devices, method 400 includes receiving commissioning data from the monitoring device (408). For example, commissioning system 302 can receive commissioning data 313A and 313B from devices 328A and 328D respectively.

Other devices (e.g., device 328B, 328C, 328D, etc.) in monitoring device network 327 can also transform sensed values (e.g., temperature, harmonics, etc.) into commissioning data. The other devices can send the commissioning data to commissioning system 302. Commissioning system 302 can receive the commissioning data from the other devices.

For each of the one or more of the plurality of monitoring devices, method 400 includes storing the commissioning data in a database for subsequent analysis and reporting to determine the likelihood of the electrical system operating as intended when released into production (409). For example, commissioning system 302 can store commissioning data 313A and 313B, as well as other commissioning data received from any other devices in monitoring device network 327, at storage device 304 (e.g., a durable storage device). Commissioning data 313A and 313B, as well as the other commissioning data, can be stored in a database table. Commissioning data 313A and 313B, as well as the other commissioning data, can be stored for subsequent analysis and reporting to determine the likelihood of electrical system 323 operating as intended when released into production. Commissioning data 313A and 313B, as well as the other commissioning data, can be aggregated into commissioning data 313.

Figure 7:
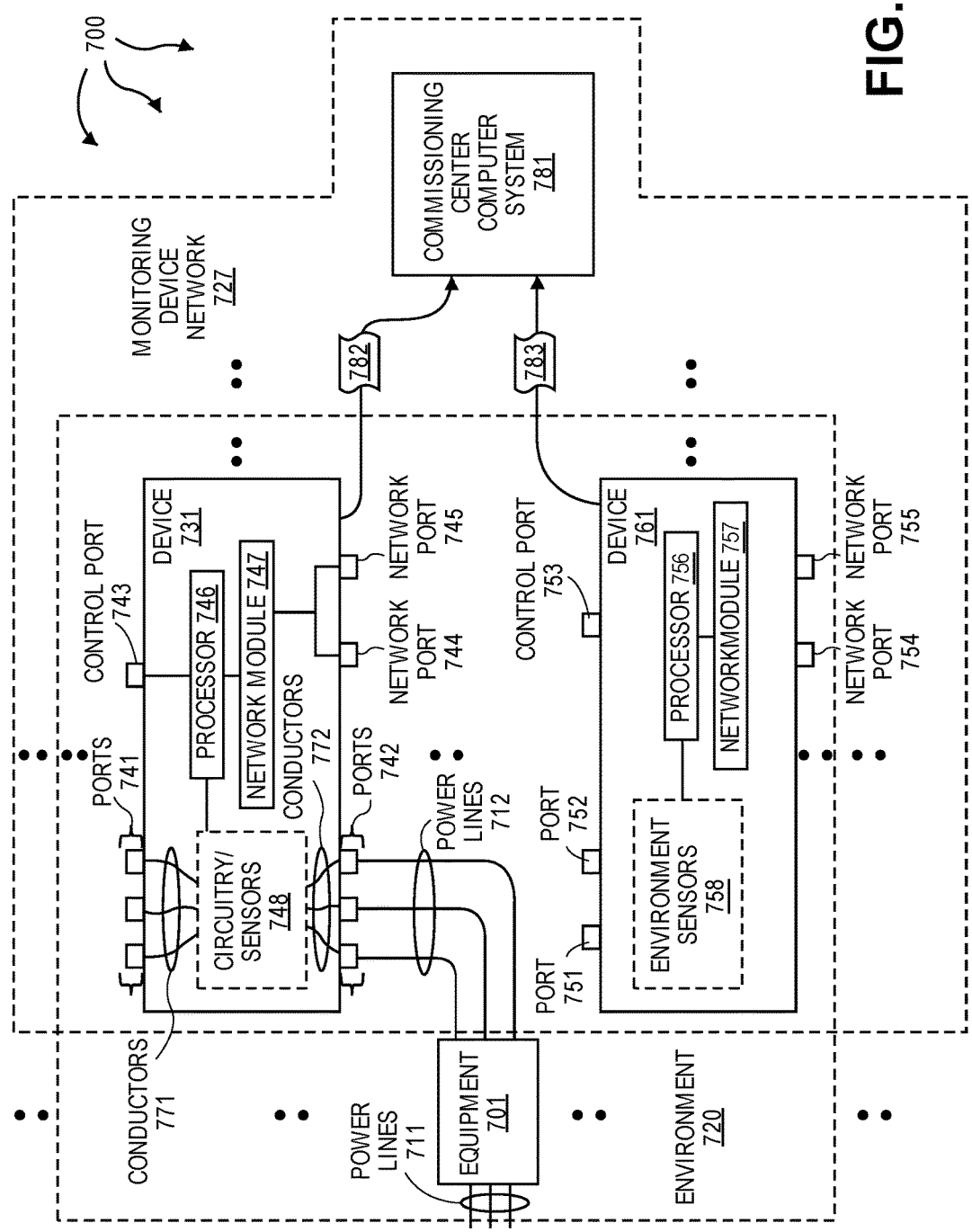
FIG. 7 illustrates a more detailed architecture of monitoring devices monitoring a piece of electrical equipment.

Turning to FIG. 7, FIG. 7 illustrates a more detailed architecture of 700 of monitoring devices 731 and 761 monitoring electrical equipment 701 in environment 720. The indicated ellipses represent that other electrical equipment and/or monitoring devices can be present both within and outside of environment 720. Devices 731 and 761 can be included in monitoring device network 727 and connected via wired and/or wireless network communication to commissioning center computer system 781 (which includes functionality similar to commissioning system 302).

Electrical equipment 701 can be a piece of power system equipment, such as, for example, a transformer, a generator, a switch, a relay, a circuit breaker, a bus bar, a battery, an alternator, an equipment (e.g., server) rack, etc. As depicted, equipment 701 receives (e.g., three-phase) power from power lines 711. Depending on equipment type, equipment 701 can perform a specified power system function.

Device 731 includes processor 746, network module 747, and circuitry/sensors 748. Conductors 771 connect circuitry/sensors 748 to ports 741. Similarly, conductors 772 connect circuitry/sensors 748 to ports 742. From electrical inputs on one or more of ports 741 and/or on one or more of ports 742, circuitry/sensors 748 can sense various electrical characteristics of electricity flowing on electrical inputs.

For example, power lines 712 are connected to device 731 through ports 742, which are in turn connected to circuitry/sensors 748 via conductors 772. As such, circuitry/sensors 748 can sense various electrical characteristics (e.g., voltage changes, current changes, transients, harmonics, ground faults, short circuits, etc.) of electricity flowing on power lines 712. Processor 746 can transform, convert, etc. the sensed electrical characteristics into commissioning data indicative of the sensed electrical characteristics. For example, processor 746 can transform, convert, etc. sensed electrical characteristics of electricity flowing on power lines 712 into commissioning data 782 indicative of the sensed electrical characteristics Network module 747 can send commissioning data 782 over monitoring device network 727 to commissioning center computer system 781. Network module 747 can include hardware and software for implementing wired and/or wireless network connections.

Network ports 744 and 745 can be configured to receive wired network connections. Through network ports 744 and 745, device 731 can be network connected to other monitoring devices and/or to electrical equipment using wired network connections. Control port 743 can be used for local connections to electrical equipment control systems when appropriate. When connected, processor 746 can control the operation of a piece of electrical equipment (e.g., to transition between test conditions, such as, energized from utility, energized from generator, switching from utility to generator, switching from generator to utility, different loads, etc.) via a local connection though control port 743. For example, commissioning center computer system 781 can send a command over monitoring network 727 to device 731. Device 731 can then locally forward the command to the electrical equipment to control operation of the electrical equipment.

Device 761 (e.g., a wireless data logger) includes processor 756, network module 757, and environmental sensors 758. Ports 751 and 752 are connected to environmental sensors 758. Environmental sensors 758 can sense environmental conditions (e.g., heat, temperature, humidity, barometric pressure, etc.) in environment 720. Other external sensors can be integrated with environmental sensors 758 through connections to port 751 and/or port 752. The external sensors as well as environmental sensors 758 can sense environmental conditions within environment 720.

Processor 756 can transform, convert, etc. the sensed environmental conditions into commissioning data indicative of the sensed environmental conditions. For example, processor 756 can transform, convert, etc. sensed environmental conditions within environment 720 into commissioning data 783 indicative of the sensed environmental conditions. Network module 757 can send commissioning data 783 over monitoring device network 727 to commissioning center computer system 781. Network module 757 can include hardware and software for implementing wired and/or wireless network connections.

Network ports 754 and 555 can be configured to receive wired network connections. Through network ports 754 and 755, device 761 can be network connected to other monitoring devices and/or to electrical equipment using wired network connections. Control port 753 can be used for local connections to electrical equipment control systems when appropriate. When connected, processor 756 can control the operation of a piece of electrical equipment (e.g., to transition between test conditions, such as, energized from utility, energized from generator, switching from utility to generator, switching from generator to utility, different loads, etc.) via a local connection though control port 753. For example, commissioning center computer system 781 can send a command over monitoring network 727 to device 761. Device 761 can then locally forward the command to the electrical equipment to control operation of the electrical equipment.

Figure 5:
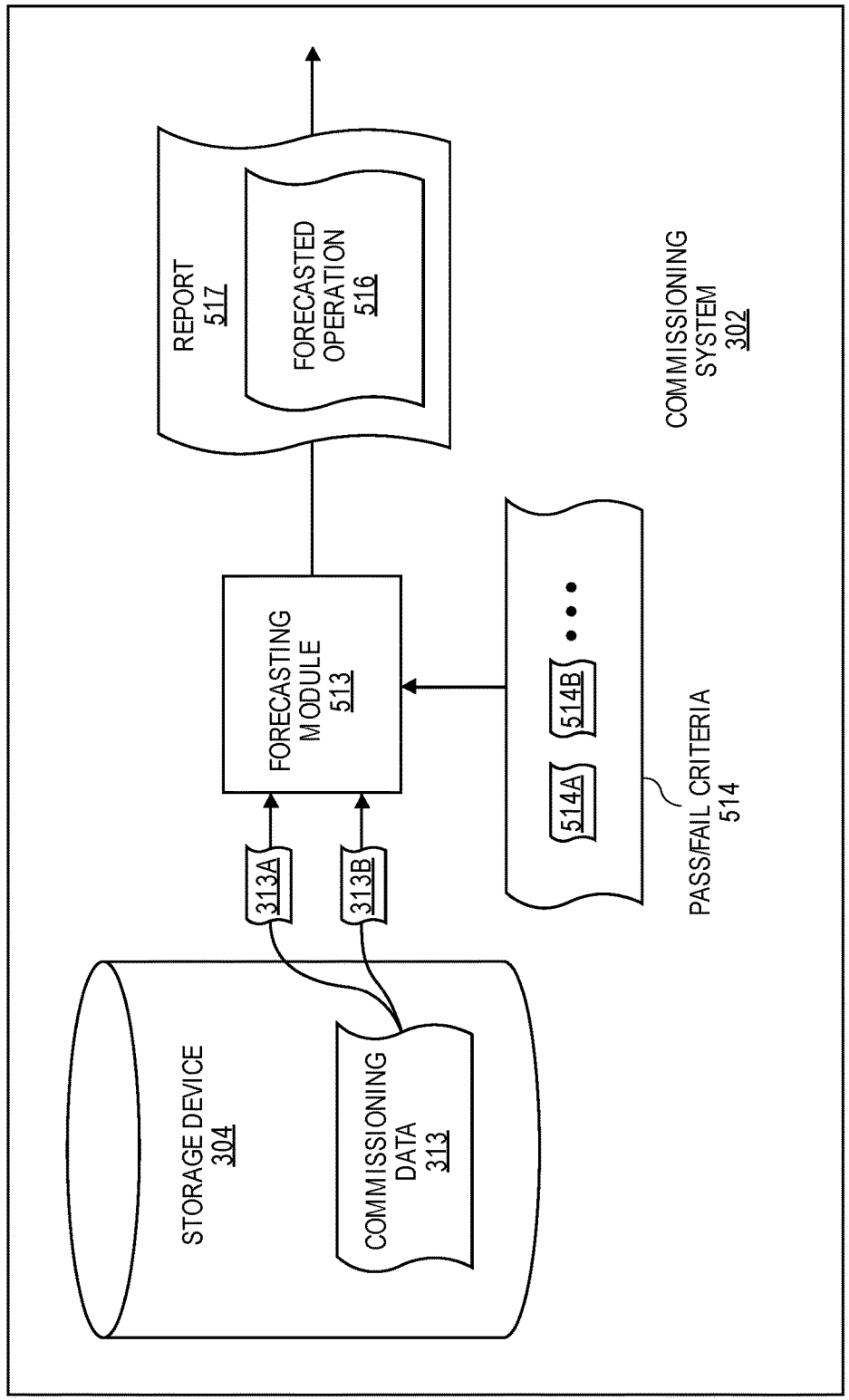
FIG. 5 illustrates additional components of a commissioning system.

FIG. 5 illustrates additional components of commissioning system 302 (which can also be realized in either of commissioning center computer systems 781 and 897). As depicted, commissioning system 302 further includes forecasting module 513. In general, forecasting module 513 can analyze commissioning data acquired from an electrical system in an automated manner to determine (forecast) the likelihood of the electrical system operating as intended when released into production.

Forecasting module 513 can refer to pass/criteria 514. Forecasting module 513 can compare commissioning data to pass/fail criteria to determine (forecast) the likelihood of the electrical system operating as intended when released into production. Pass/fail criteria 514 can have varied levels of granularity. Some pass/fail criteria can apply to specific types and/or pieces of electrical equipment and/or environments in an electrical system. Other pass/fail criteria can apply to groupings of electrical equipment and/or environments in an electrical system or even to an electrical system as a whole.

In one aspect, pass/fail criteria for commissioning an electrical system are tailored to the electrical system. For example, pass/fail criteria 514 can be formulated to validate specific types and/or pieces of electrical equipment and/or environments in the electrical system 323 for intended operation. Since electrical characteristics and environmental conditions can be captured for many different pieces of electrical equipment, relatively complex pass/fail criteria can be formed. Pass/fail criteria 514 can be used to validate operation of a variety of different pieces of electrical equipment, under a variety of different environmental conditions, and under a variety of different test conditions. Pass/fail criteria 514 can include/indicate relationships between commissioning data acquired for different pieces of electrical equipment and/or acquired for different environments.

Figure 6:
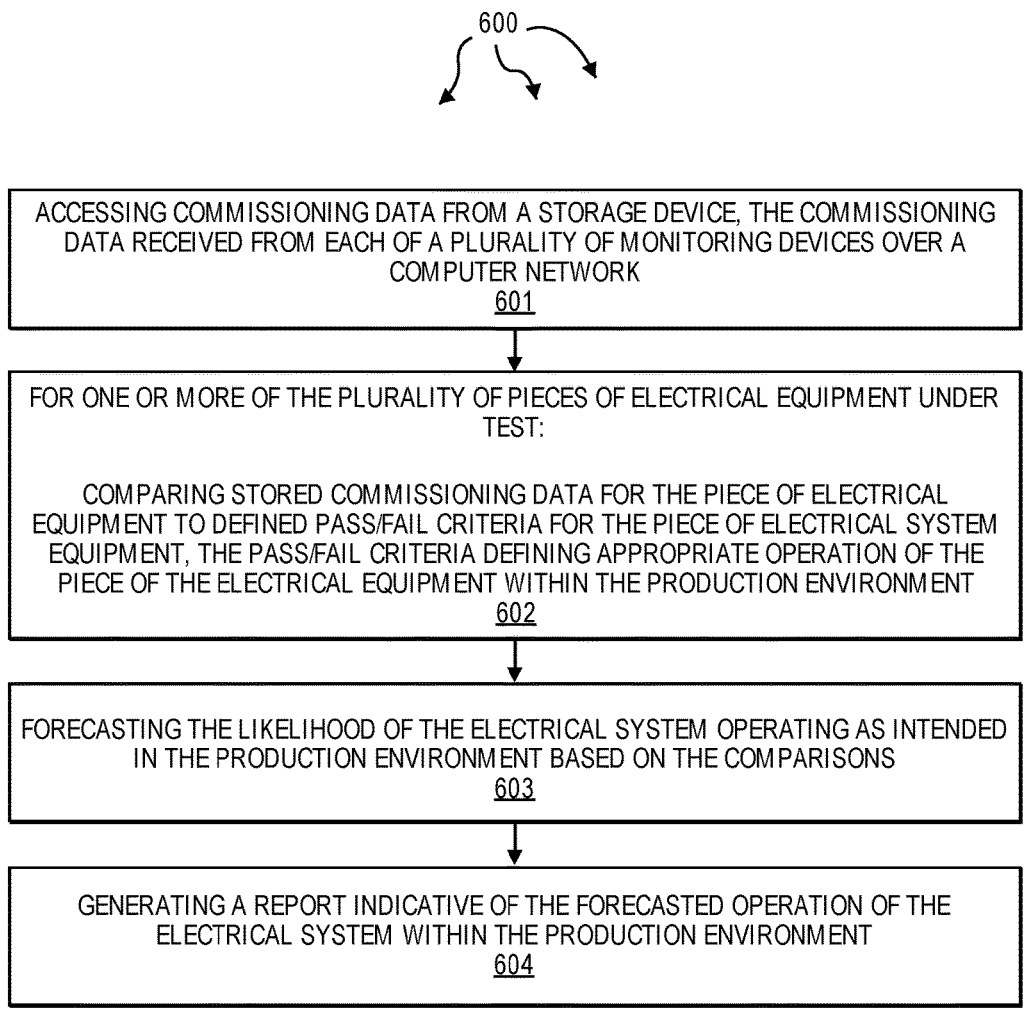
FIG. 6 illustrates a flow chart of an example method for generating a commissioning report.

FIG. 6 illustrates a flow chart of an example method 600 for determining a likelihood of an electrical system operating as intended when released into production. Method 600 will be described with respect to the components and data of architecture 300 and additional components of commissioning system 302 depicted in FIG. 5.

Method 600 can be used to determine a likelihood of electrical system 323 operating as intended when released into production. For example, method 600 can be used to determine the likelihood of electrical system 323 safely providing a stable power source for servers installed (e.g., in server racks) at data center 301 under a variety of different operating conditions. The variety of different operating conditions can include, but are not limited to, energized from utility, energized from generator, switching from utility to generator, switching from generator to utility, different loads, etc.

Method 600 includes accessing commissioning data from a storage device, the commissioning data received from each of a plurality of monitoring devices over a computer network (601). For example, forecasting module 513 can access commissioning data 313 from storage device 304. As described, commissioning data 313 was received from each of a plurality of monitoring devices in monitoring device network 327 over a wired and/or wireless computer network.

For one or more of the plurality of pieces of electrical equipment under test, method 600 includes comparing stored commissioning data for the piece of electrical equipment to defined pass/fail criteria for the piece of electrical system equipment, the pass/fail criteria defining appropriate operation of the piece of the electrical equipment within the production environment (602). For example, forecasting module 513 can access pass/fail criteria 514A. Pass/fail criteria 514A can define appropriate operation of equipment 324A under a variety of different operation conditions in data center 301. Forecasting module 513 can compare commissioning data 313A, as well as other commissioning data for equipment 324A, to pass/fail criteria 514A.

Similarly, forecasting module 513 can access pass/fail criteria 514B. Pass/fail criteria 514B can define appropriate operation of equipment 324C under a variety of different operation conditions in data center 301. Forecasting module 513 can compare commissioning data 313B, as well as other commissioning data for equipment 324B, to pass/fail criteria 514B. Forecasting module 513 can perform similar comparisons of commissioning data to pass/fail criteria for other electrical equipment, such as, for example, electrical equipment 324B, 324D, 324E, etc.

Method 600 includes forecasting the likelihood of the electrical system operating as intended in the production environment based on the comparisons (603). For example, forecasting module 513 can formulate forecasted operation 516 based on comparisons of commissioning data 313 to pass/fail criteria 514. Forecasted operation 516 can forecast the likelihood of electrical system 323 safely providing a stable power source for servers installed (e.g., in server racks) at data center 301 under a variety of different operating conditions.

Method 600 includes generating a report indicative of the forecasted operation of the electrical system within the production environment (604). For example, forecasting module 513 can generate report 517 including forecasted operation 516.

Commissioning system 320 can output report 517 through a (e.g., graphical) user-interface. An operator of commissioning system 302 (e.g., a commissioning agent) can view report 517 at the user-interface. In one aspect, report 517 is provided in essentially real-time. Based on report 517, the operator can make additional decisions with respect to releasing electrical system 323 into production. For example, the operator can initiate further commissioning, for example, if report 517 indicates possible unsafe and/or unstable operation of electrical system 323 (or components thereof) under some set of operating conditions. Further commissioning can include collecting additional commissioning data, comparing commissioning data 313 to different pass/fail criteria, generating additional reports, etc. Alternately, the operator may be satisfied with the content of report 517 and release electrical system 323 into production.

Externally Exposing Internal Electrical Power System Connections

To increase safety during electrical system commissioning, internal electrical power system lines and connections within electrical/power system equipment can be externally exposed at a panel or device. Exposing internal electrical power system lines and connections at a panel or device significantly reduces, and potentially eliminates, hazardous activities associated with removing and replacing panels and connecting wires to and disconnected wires from to internal electrical power system lines and connections.

Figure 8A:
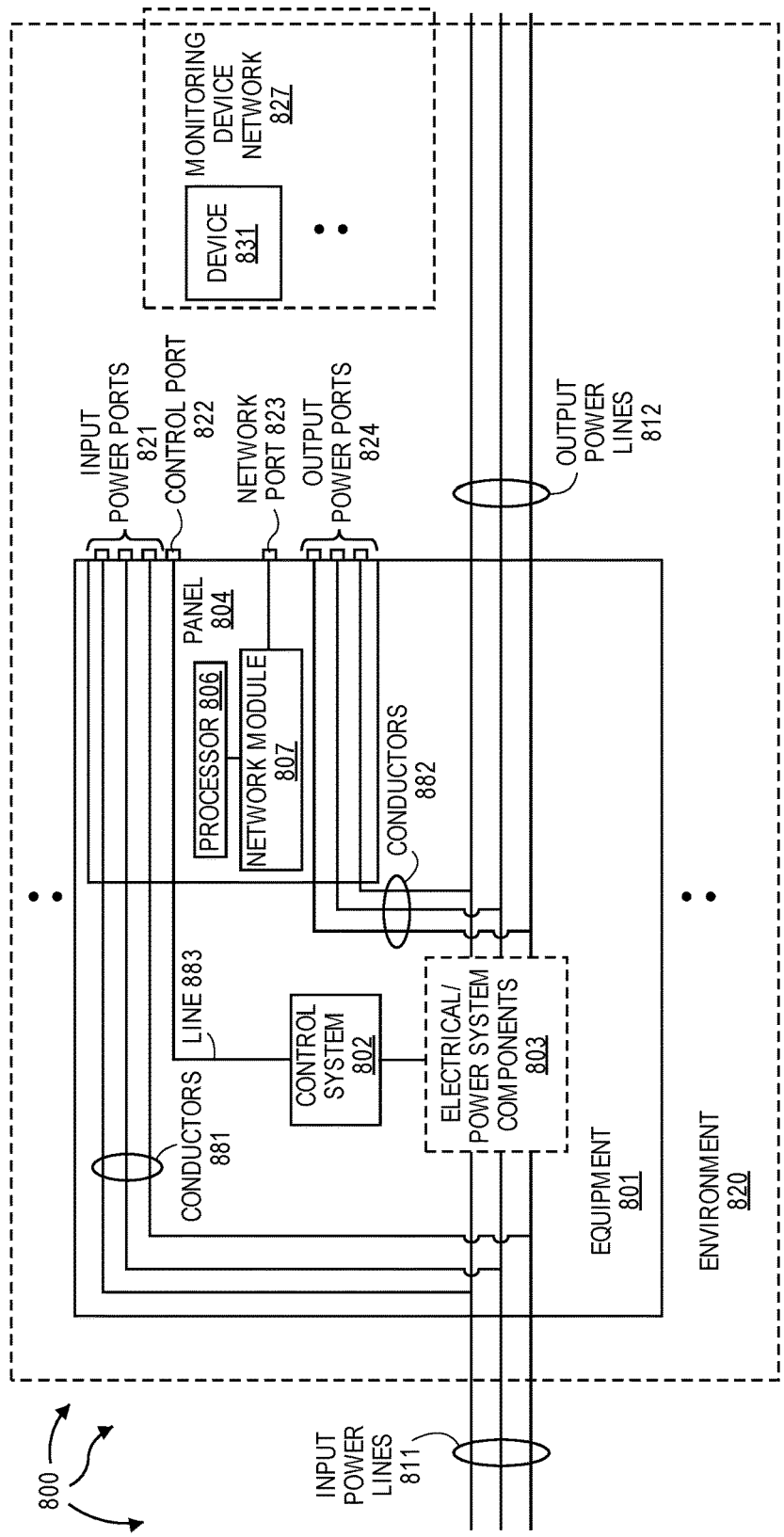
FIG. 8A illustrates an example piece of electrical system equipment with an attached panel for externally exposing connections to internal power system electrical wiring inside the piece of electrical system equipment.

FIG. 8A illustrates a piece of electrical system equipment 801 with an attached panel 804 for externally exposing connections to internal power system electrical wiring inside the piece of electrical system equipment 801. Equipment 801 includes control system 802, electrical/power system components 803, and panel 804. Panel 804 further includes processor 806, network module 807, input power ports 821, control port 832, network port 823, and output power ports 824. Equipment 801 operates in environment 820. Equipment 801 receives (e.g., three-phase) power on input power lines 811 and sends (e.g., three-phase) power on output power lines 812.

Panel 804 can be constructed of the same material used to house control system 802 and electrical/power system components 803. Panel 804 be located on a higher visibility area of equipment 801.

As depicted, conductors 881 connect input power lines 811 to input power ports 821. Similarly, conductors 882 connect output power lines 812 to output power ports 824. Control system 802 is configured to control the operation of electrical/power system components 803 to transition electrical/power system components 803 between different operating conditions (e.g., energized from utility, energized from generator, switching from utility to generator, switching from generator to utility, different loads). Control system 802 can receive commands on line 883. Commands can be received from processor 806 or from an external device via a connection at control port 822.

Network module 807 can be connected to network port 823. Network module 823 can include hardware and software for implementing wired and/or wireless network connections. Network port 823 can be configured to receive wired network connections. Through network port 823, equipment 801 can be network connected to monitoring devices and/or to other electrical equipment using wired network connections. Network module 807 can also wirelessly connect equipment 801 to monitoring devices and/or to other electrical equipment using wireless network connections.

In may be that panel 804 also includes ports wired to one or more components within electrical/power system components 803.

In one aspect, panel 804 is integrated into equipment 801 during manufacture of equipment 801. In another aspect, panel 804 is fitted to equipment 801 after manufacture of equipment 801 (e.g., at a facility, such as, a data center, where equipment 801 is to be used). When panel 804 is integrated during manufacture, there is no need to access the inside of equipment 801. The ports of panel 804 can be used to connect to internal electrical power system wiring and other internal components of equipment 801.

In a further aspect, connections are made between input power lines 811, output power lines 812, control system 802, and network module 207 and an external device. The external device can include ports similar to input power ports 821, output power ports 824, control port 822, and network port 823. Monitoring devices can then be connected to the external device in a manner similar to connections to panel 804. When panel 804 is fitted to equipment 801 or connections are made to an external device, access the inside of equipment 801 is significantly reduced. For example, equipment 801 can be opened up once to make relevant connections and then closed back up. The ports of panel 804 or the external device can then be used to connect to internal electrical power system wiring and other internal components of equipment 801.

As depicted, device 831 is included in monitoring device network 827. Device 831 is also included in environment 820. In general, device 831 can monitor operation of equipment 801 and/or conditions in environment 820 under different operating conditions.

The indicated ellipses in FIG. 8A represent that other electrical equipment and/or monitoring devices can be present both within and outside of environment 820.

Figure 8B:
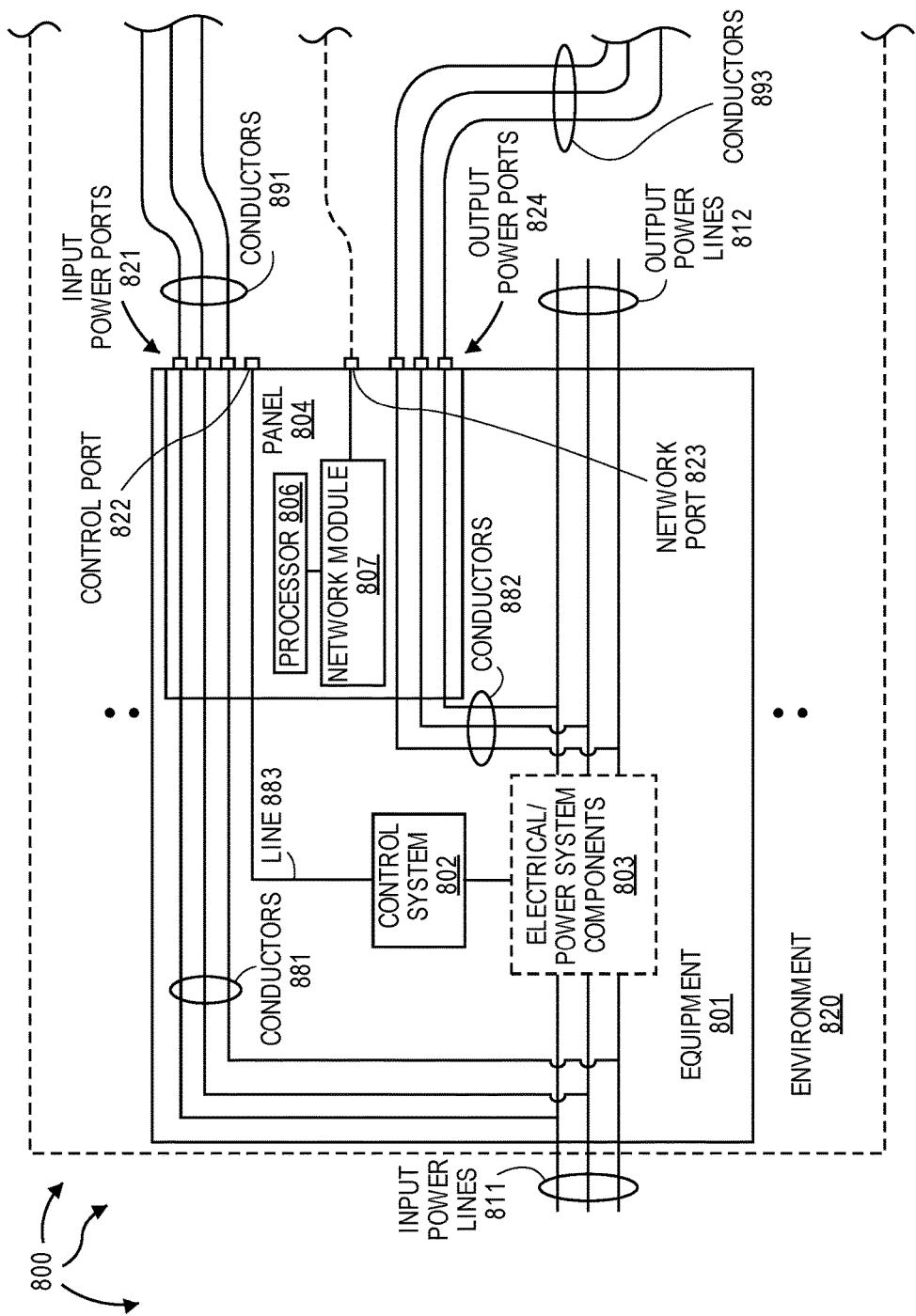
FIGS. 8B and 8C illustrate the example piece of electrical system equipment from FIG. 8A connected to a monitoring device through connections at the attached panel.
Figure 8C:
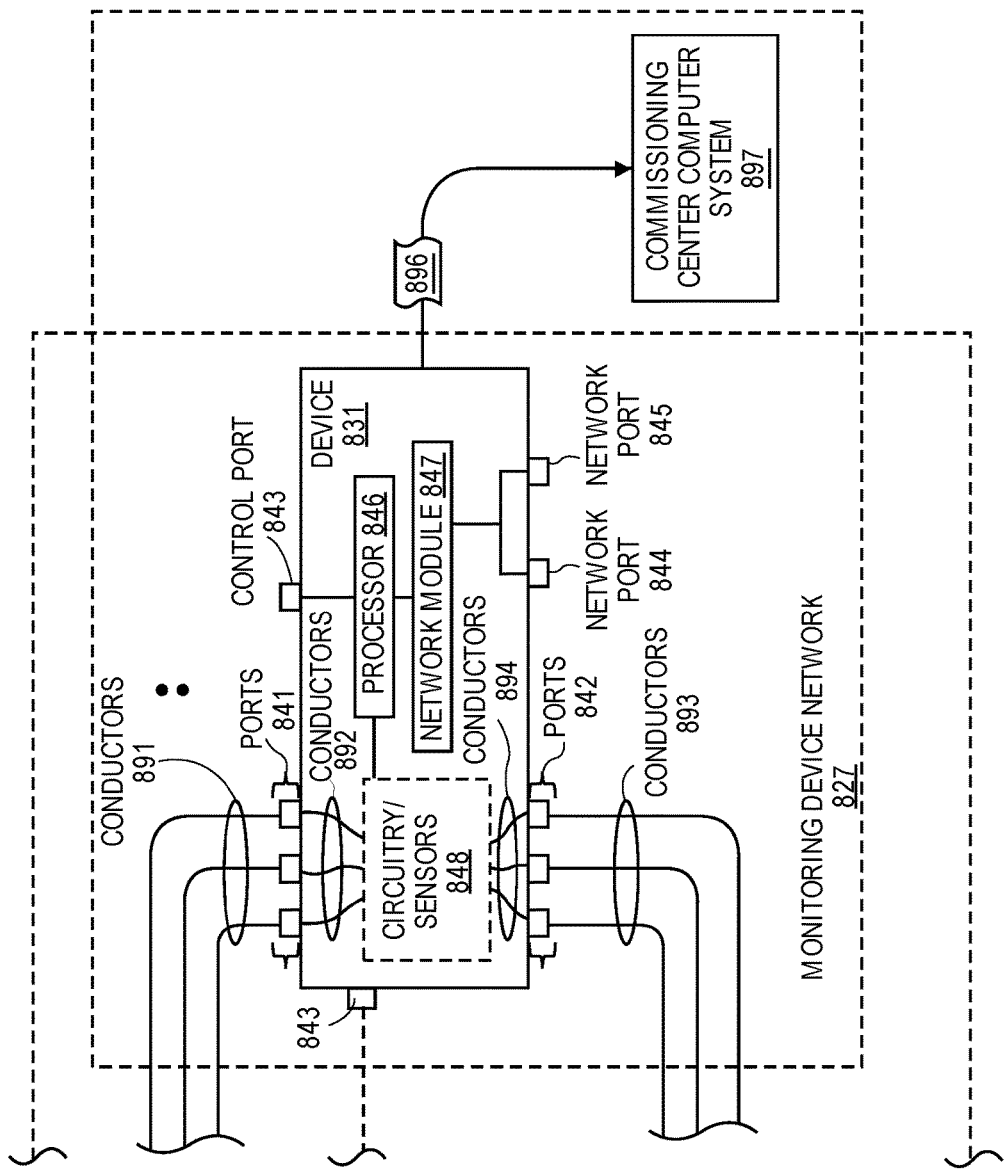

Turning to FIG. 8B, FIGS. 8B and 8C illustrate the piece of electrical system equipment 801 connected to device 831 through connections at the attached panel 804.

As depicted, device 831 includes processor 846, network module 847, circuitry/sensors 848, ports 841, ports 842, port 843, and port 844. Conductors 892 connect ports 841 to circuitry/sensors 848. Similarly, conductors 894 connect ports 842 to circuitry/sensors 848.

Conductors (wires) 891 connect ports 821 to corresponding ports 841. Conductors 892 then connect to circuitry/sensors 848. As such, circuitry/sensors 848 are connected to and can sense various electrical characteristics of electricity flowing on input power lines 811. Conductors (wires) 893 connect ports 824 to corresponding ports 842. Conductors 894 then connect to circuitry/sensors 848. As such, circuitry/sensors 848 are connected to and can sense various electrical characteristics of electricity flowing on output power lines 812. Processor 846 can transform, convert, etc. sensed electrical characteristics of electricity flowing on input power lines 811 and output power lines 812 into commissioning data 896 indicative of the sensed electrical characteristics Network module 847 can send commissioning data 896 over monitoring device network 827 to commissioning center computer system 897. Network module 847 can include hardware and software for implementing wired and/or wireless network connections.

Network ports 844 and 845 can be configured to receive wired network connections. Through network ports 844 and 845, device 831 can be network connected to other monitoring devices and/or to electrical equipment using wired network connections. For example, a wired network connection can be made between network port 823 to network port 844.

Control port 843 can be used for local connections to electrical equipment control systems when appropriate. When connected, processor 846 can control the operation of a piece of electrical equipment (e.g., to transition between test conditions, such as, energized from utility, energized from generator, switching from utility to generator, switching from generator to utility, different loads, etc.) via a local connection though control port 843. For example, a wired connection can be made between control port 822 and control port 843. Commissioning center computer system 897 (which includes functionality similar to commissioning system 302 and commissioning center computer system 781) can send a command over monitoring network 827 to device 831. Device 831 can then locally forward the command to equipment 801 through control port 843.

In one aspect, connectors on ports at equipment 801 and device 831 are configured for seamless connection with corresponding connectors on wires. For example, ports 821 and 841 can be configured for seamless connection with corresponding connectors on each end of wires 891. Ports 822 and 843 can be configured for seamless connection with a corresponding connector on a wire connecting ports 822 and 843. Ports 823 and 844 can be configured for seamless connection with corresponding connectors on a wire connecting ports 822 and 843.

Different connectors can be used for different types of connections. For example, one type of connector can be used for connecting to power, another type of connector can be used for connecting to equipment controls, and another kind of connector can be used for network connections. A panel can include connectors for each different type of connection such that it is essentially "impossible-to-get-wrong" when connecting a piece of electrical equipment to a monitoring device.

In one aspect, connectors at ports on a piece of electrical equipment or on a device are female connectors and connectors on wire used to connect between ports are correspondingly matched male connectors. For example, each of ports 821 and 841 can include female connectors and both ends of each of wires 891 can include corresponding matched male connectors.

In another aspect, a multi-connection (e.g., multi-pin) port is wired to some, and potentially all, relevant internal wires and components within a piece of electrical equipment. Thus, many, and possibly all, relevant internal wires and components within a piece of electrical equipment can be externally exposed at the same port. Monitoring devices can include a similarly configured port to sense electrical characteristics at each of the relevant internal wires and components. A multi-conductor cable can be used to connect between the panel and a monitoring device. Connectors at each port and on each end of the wire can be configured for seamless plug-in connection.

The present described aspects may be implemented in other specific forms without departing from its spirit or essential characteristics. The described aspects are to be considered in all respects only as illustrative and not restrictive. The scope is, therefore, indicated by the appended claims rather than by the foregoing description. All changes which come within the meaning and range of equivalency of the claims are to be embraced within their scope.

What is claimed:

1. A piece of electrical system equipment, the piece of electrical system equipment comprising:
   a connection to a plurality of input power lines;
   a connection to a plurality of output power lines;
   power system components connected between the input power lines and the output power lines, the power system components performing one or more power system operations, the power system components performing different power system operations under different operating conditions present at the piece of electrical system equipment;
   a control system connected to the power system components, the control system changing the operating conditions present at the piece of electrical system equipment in response to control commands; and
   a panel integrated into the piece of electrical system equipment, the panel comprising:
   a plurality of input power ports, each of the plurality of input power ports wired to a corresponding one of the plurality of input power lines, the plurality of input power ports externally exposing the plurality of input power lines for connection to monitoring devices; and
   a plurality of output power ports, each of the plurality of output power ports wired to a corresponding one of the plurality of output power lines, the plurality of output power ports externally exposing the plurality of output power lines for connection to monitoring devices.

2. The piece of electrical equipment as recited in claim 1, the panel further comprising a control port, the control port wired to the control system, the control port externally exposing the control system to external devices.

3. The piece of electrical equipment as recited in claim 1, the panel further comprising network hardware, the network hardware for network communication on a computer network.

4. The piece of electrical equipment as recited in claim 3, the panel further comprising a network port, the network port wired to the network hardware, the network port exposing the network hardware for external wired network connections.

5. The piece of electrical equipment as recited in claim 1, the panel further comprising one or more additional ports, each of the one or more additional ports wired to portion of the power system components, the one or more additional ports externally exposing the portions of the power system components for connection to monitoring devices.

6. The piece of electrical equipment as recited in claim 1, wherein the piece of electrical equipment is selected from among: a transformer, a generator, a switch, a relay, a circuit breaker, a bus bar, a battery, an alternator, or an equipment rack.

7. The piece of electrical equipment as recited in claim 1, wherein the control system changing the operating conditions present at the piece of electrical system comprises the control system changing the operating conditions present at the piece of electrical system equipment between any of: energized from utility, energized from generator, switching from utility to generator, switching from generator to utility, different loads.

8. The piece of electrical equipment as recited in claim 1, wherein the control system changing the operating conditions present at the piece of electrical system comprises the control system changing the load present at the piece of electrical system equipment.

9. The piece of electrical equipment as recited in claim 1, wherein a plurality of input power ports and the plurality of output power ports comprise female connectors for seamless connection to male connectors attached to wires plugged into any of the plurality of input power ports and the plurality of output power ports.

10. An apparatus for use with a piece of electrical system equipment, the apparatus comprising:
a plurality of input power ports, each of the plurality of input power ports:
wired for connecting to a corresponding one of a plurality of input power lines in the piece of electrical system equipment to externally expose electrical characteristics of electricity flowing through the one of the plurality of input power lines for connection to monitoring devices; and
including a connector for connecting an external wire to the input power port; and
a plurality of output power ports, each of the plurality of output power ports:
wired for connecting to a corresponding one of a plurality of output power lines in the piece of electrical system equipment to externally expose electrical characteristics of electricity flowing through the one of the plurality of output power lines for connection to monitoring devices; and
including a connector for connecting an external wire to the output power port.

11. The apparatus of claim 10, further comprising one or more additional ports, each of the one or more additional ports wired for connecting to power system components in the piece of electrical system equipment to externally expose electrical characteristics of electricity flowing through the power system components for connection to monitoring devices under a plurality of different operation conditions.

12. The apparatus of claim 11, further comprising a control port, the control port wired for connecting to a control system in the piece of electrical equipment, the control system changing between the plurality of different the operating conditions, the control port externally exposing the control system for connection to other devices.

13. The apparatus of claim 10, further comprising network hardware, the network hardware for network communication on a computer network.

14. The apparatus of claim 10, further comprising a network port, the network port wired to the network hardware, the network port exposing the network hardware for external wired network connections.

15. The apparatus of claim 10, wherein a connector for connecting an external wire to the input power port comprises the connector configured for seamless connection to a corresponding connecter on a wire.

16. The apparatus of claim 10, wherein the apparatus is a panel.

17. The apparatus of claim 10, wherein the apparatus is a device.

18. A panel for fitting to a piece of electrical system equipment, the apparatus comprising:
a plurality of input power ports, each of the plurality of input power ports:
wired for connecting to a corresponding one of a plurality of input power lines in the piece of electrical system equipment to externally expose electrical characteristics of electricity flowing through the one of the plurality of input power lines for connection to monitoring devices; and
including a connector for connecting an external wire to the input power port;
a plurality of output power ports, each of the plurality of output power ports:
wired for connecting to a corresponding one of a plurality of output power lines in the piece of electrical system equipment to externally expose electrical characteristics of electricity flowing through the one of the plurality of output power lines for connection to monitoring devices; and
including a connector for connecting an external to the output power port;
one or more additional ports, each of the one or more additional ports wired for connecting to power system components in the piece of electrical system equipment to externally expose electrical characteristics of electricity flowing through the power system components for connection to monitoring devices under a plurality of different operation conditions; and
a control port, the control port wired for connecting to a control system in the piece of electrical equipment, the control system changing between the plurality of different the operating conditions, the control port externally exposing the control system for connection to other devices.

19. The panel of claim 18, further comprising network hardware, the network hardware for network communication on a computer network.

20. The panel of claim 18, further comprising a network port, the network port wired to the network hardware, the network port exposing the network hardware for external wired network connections.

* * * * *